(12) United States Patent
Yang et al.

(10) Patent No.: US 11,201,229 B2
(45) Date of Patent: Dec. 14, 2021

(54) STRUCTURE AND FORMATION METHOD OF SEMICONDUCTOR DEVICE WITH METAL GATE STACK

(71) Applicant: Taiwan Semiconductor Manufacturing Co., Ltd., Hsinchu (TW)

(72) Inventors: Chansyun David Yang, Shinchu (TW); Li-Te Lin, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/657,224

(22) Filed: Oct. 18, 2019

(65) Prior Publication Data
US 2021/0119012 A1 Apr. 22, 2021

(51) Int. Cl.
H01L 29/66 (2006.01)
H01L 21/02 (2006.01)
H01L 29/423 (2006.01)

(52) U.S. Cl.
CPC .. H01L 29/66545 (2013.01); H01L 21/02274 (2013.01); H01L 29/42364 (2013.01); H01L 29/6653 (2013.01)

(58) Field of Classification Search
CPC ......... H01L 29/66545; H01L 29/42364; H01L 29/6653; H01L 21/02274
See application file for complete search history.

(56) References Cited

U.S. PATENT DOCUMENTS

| 8,772,109 | B2 | 7/2014 | Colinge | |
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 10,522,642 | B2* | 12/2019 | Lee | H01L 21/02068 |
| 2013/0093019 | A1* | 4/2013 | Ando | H01L 29/66803 257/347 |
| 2016/0365426 | A1* | 12/2016 | Ching | H01L 29/66795 |
| 2018/0151689 | A1* | 5/2018 | Xie | H01L 29/6656 |
| 2018/0288326 | A1* | 10/2018 | Lin | H01L 29/4991 |

* cited by examiner

Primary Examiner — Christine A Enad
(74) Attorney, Agent, or Firm — Birch, Stewart, Kolasch & Birch, LLP

(57) ABSTRACT

A structure and a formation method of a semiconductor device are provided. The method includes forming a dummy gate stack over a semiconductor substrate and forming a spacer element over a sidewall of the dummy gate stack. The spacer element has an inner spacer and a dummy spacer, and the inner spacer is between the dummy spacer and the dummy gate stack. The method also includes forming a dielectric layer to surround the spacer element and the dummy gate stack and replacing the dummy gate stack with a metal gate stack. The method further includes removing the dummy spacer of the spacer element to form a recess between the inner spacer and the dielectric layer. In addition, the method includes forming a sealing element to seal the recess such that a sealed hole is formed between the metal gate stack and the dielectric layer.

20 Claims, 19 Drawing Sheets

STRUCTURE AND FORMATION METHOD OF SEMICONDUCTOR DEVICE WITH METAL GATE STACK

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
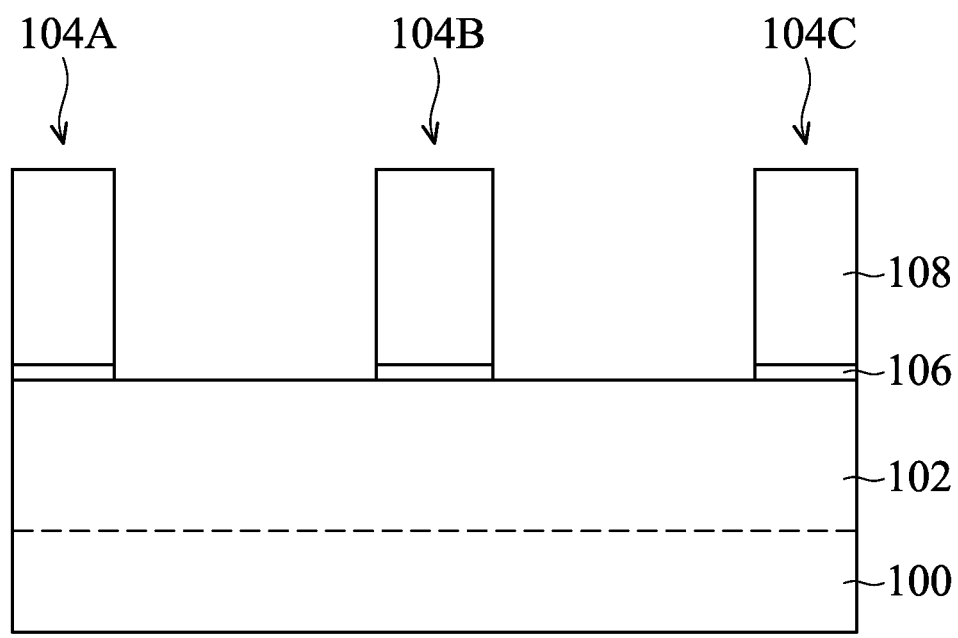
FIGS. 1A-1T are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Figure 1B:
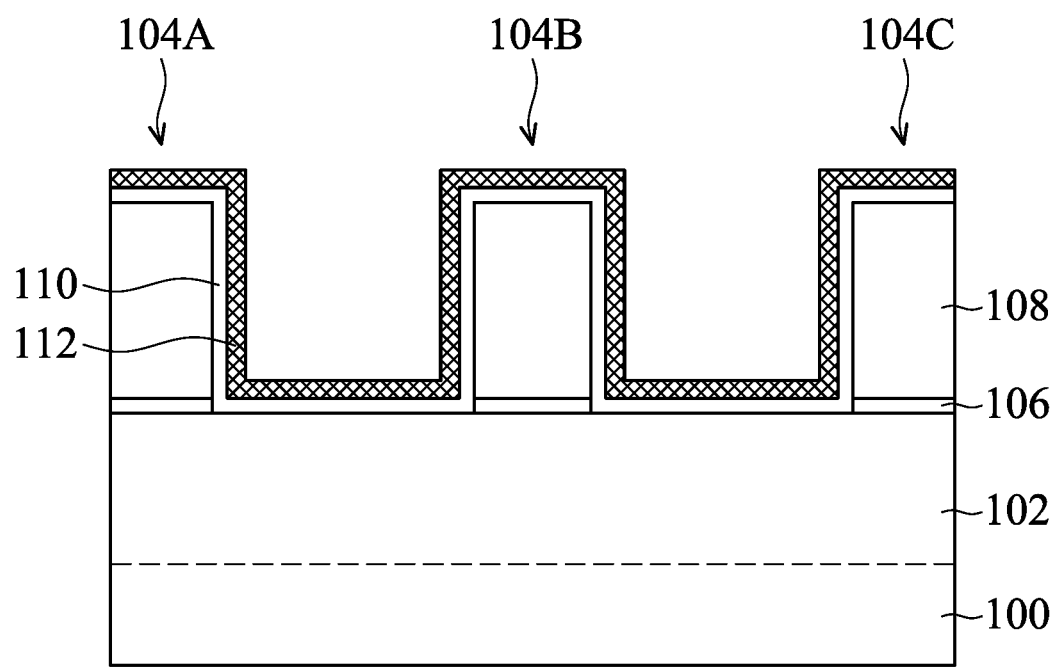
Figure 1C:
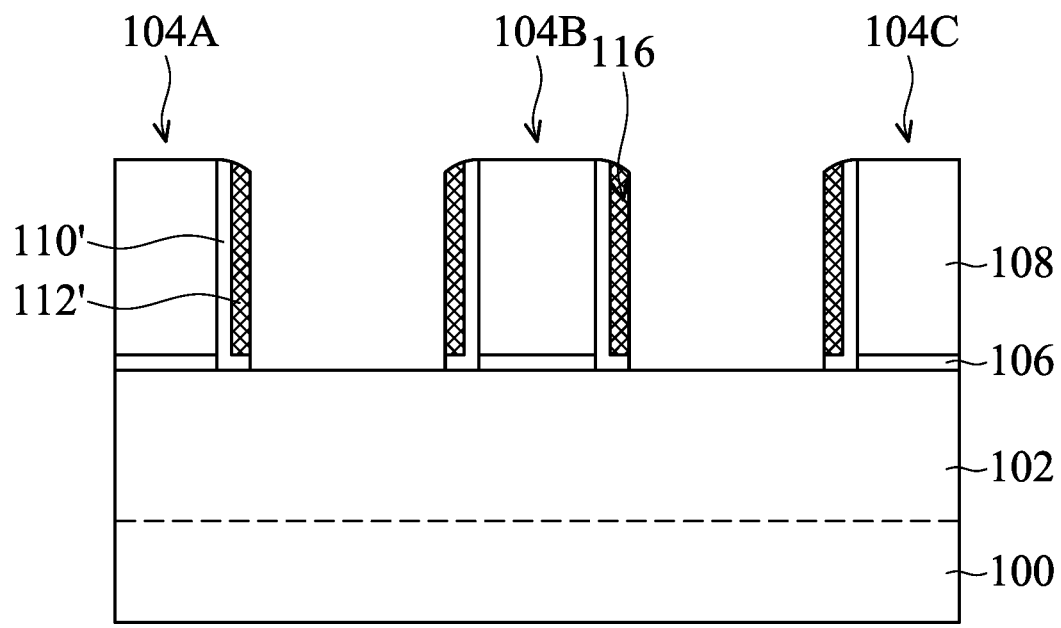
Figure 1D:
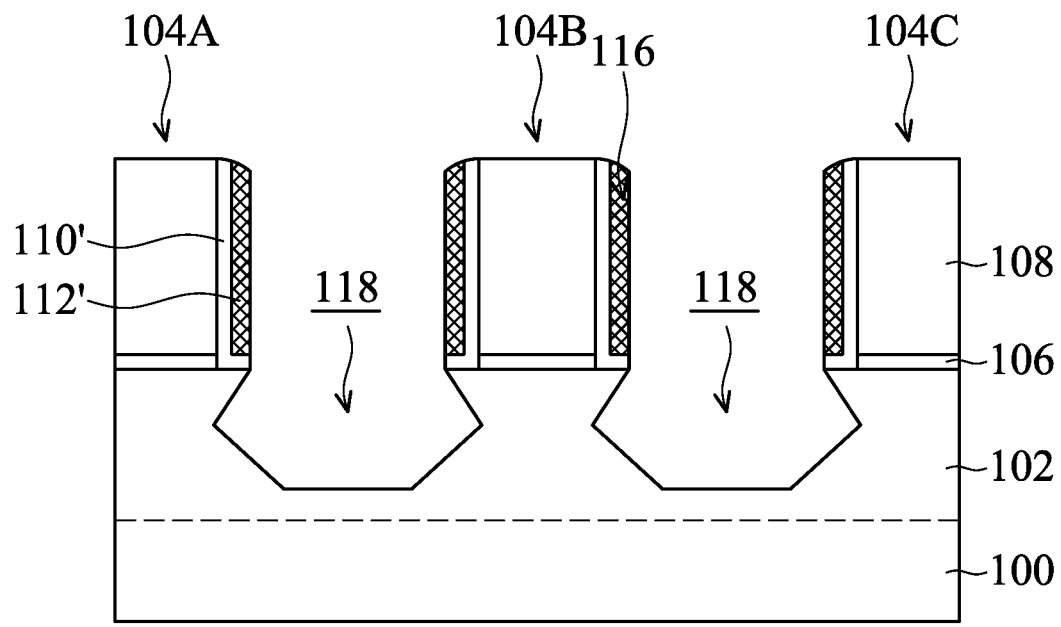
Figure 1E:
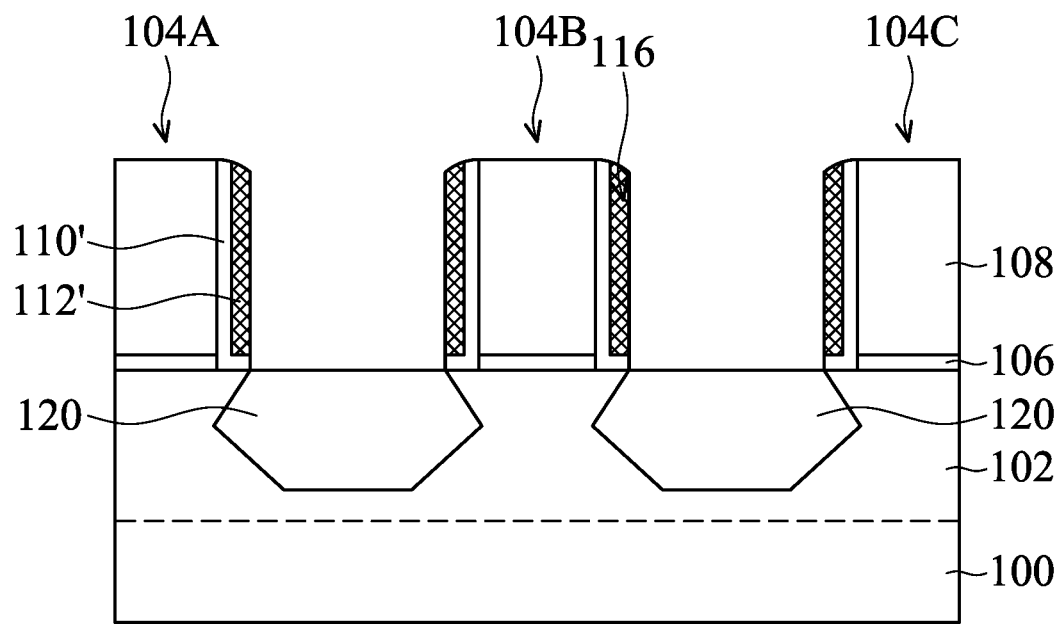
Figure 1F:
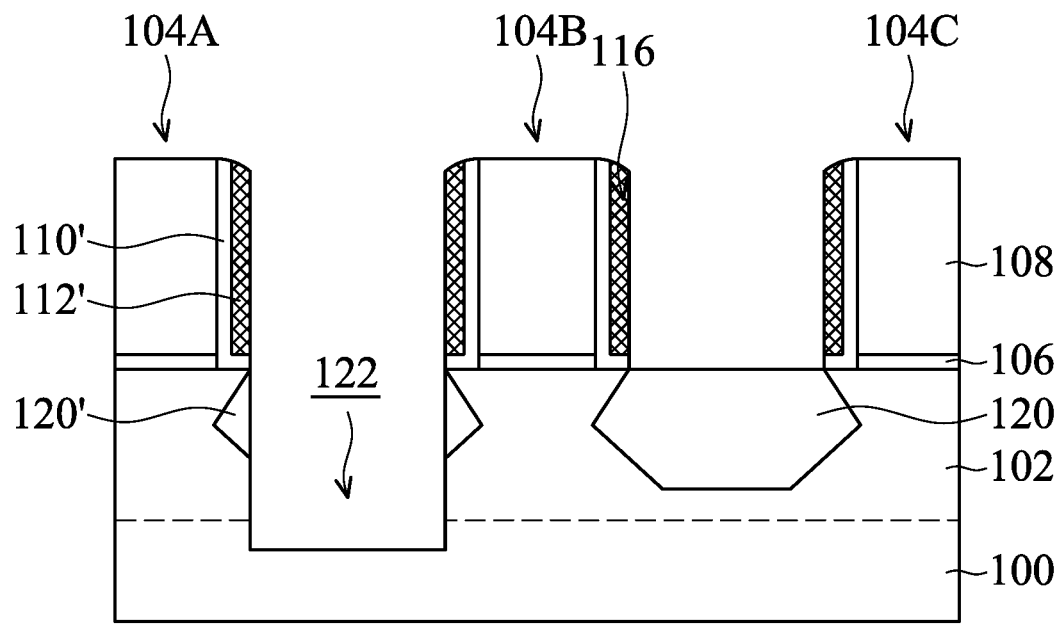
Figure 1G:
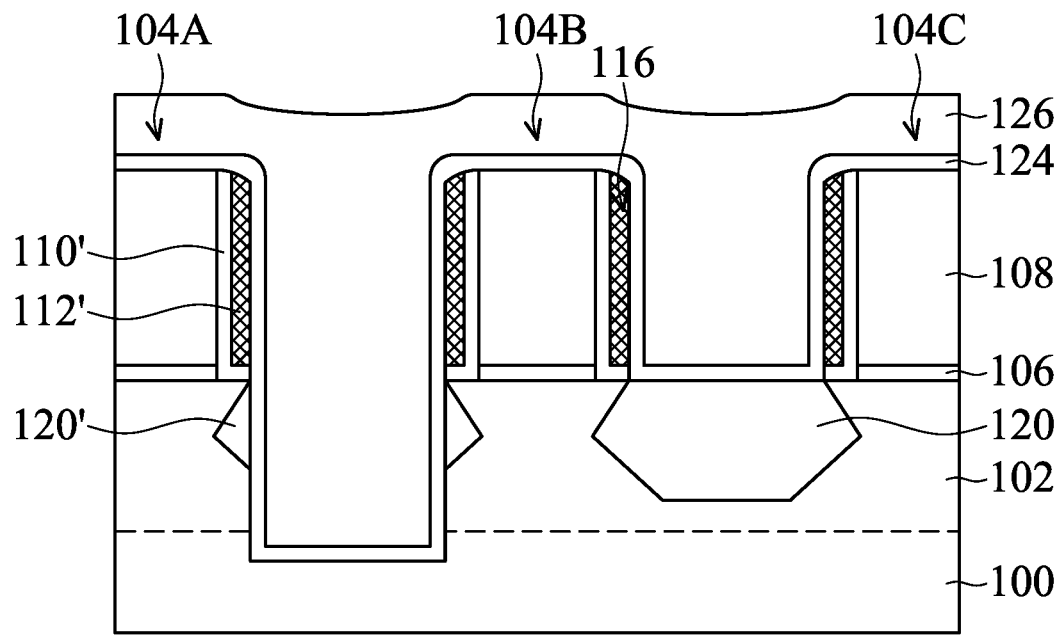
Figure 1H:
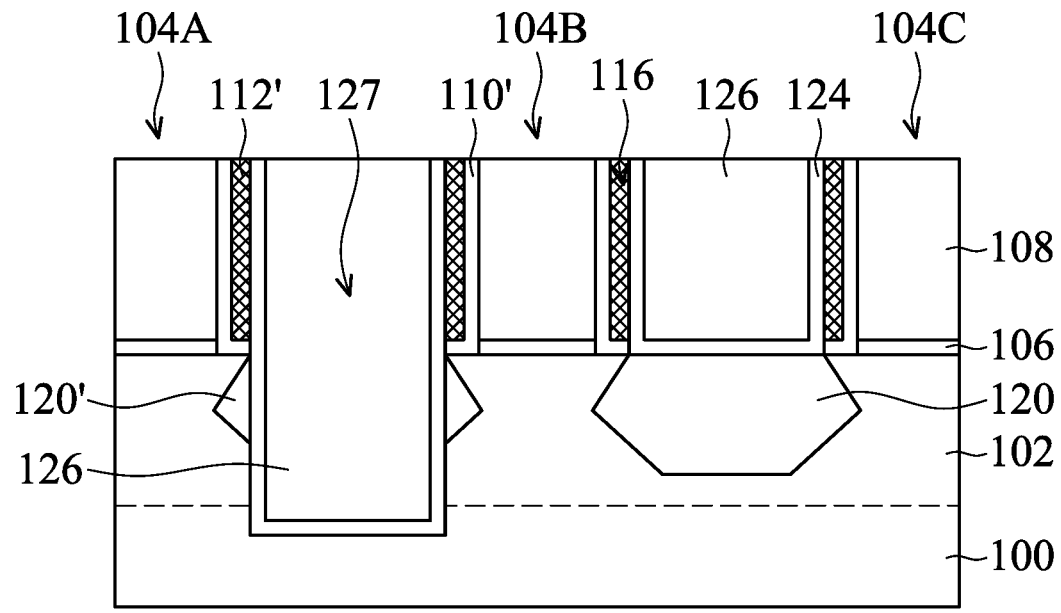
Figure 1I:
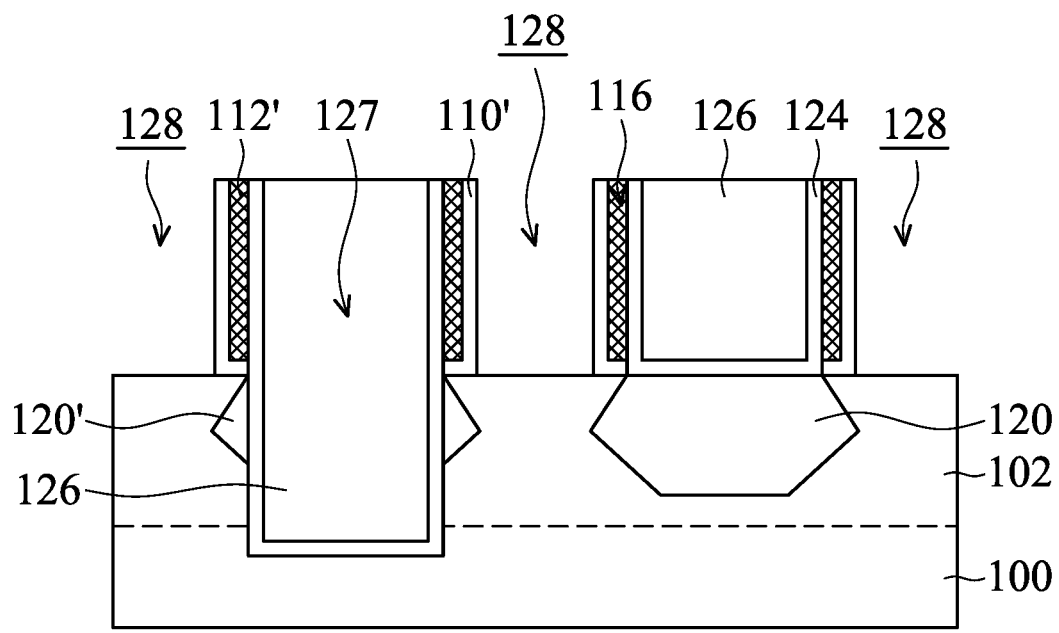
Figure 1J:
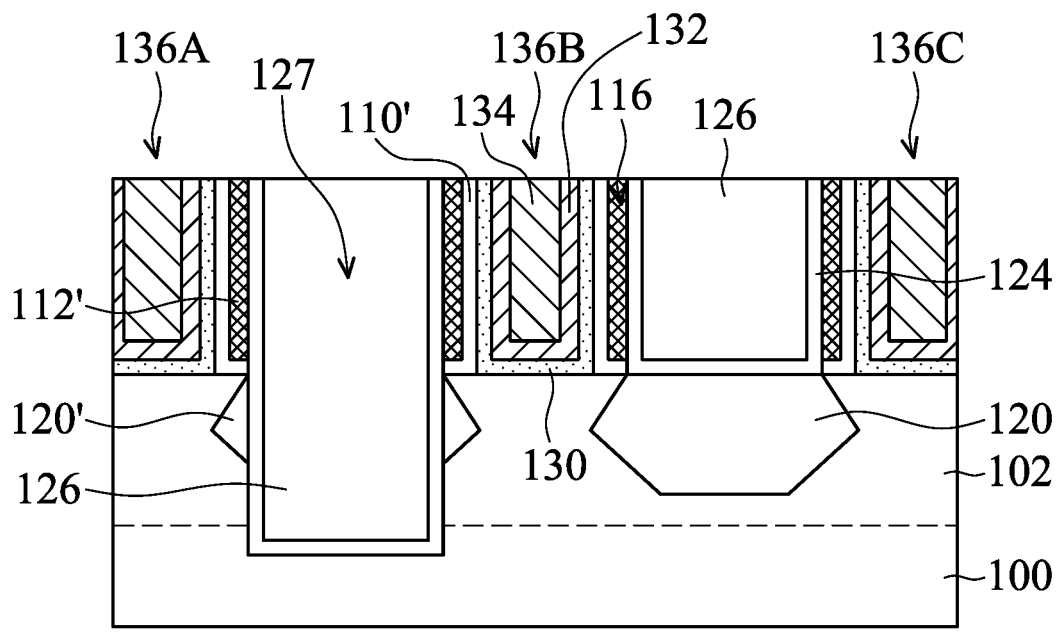
Figure 1K:
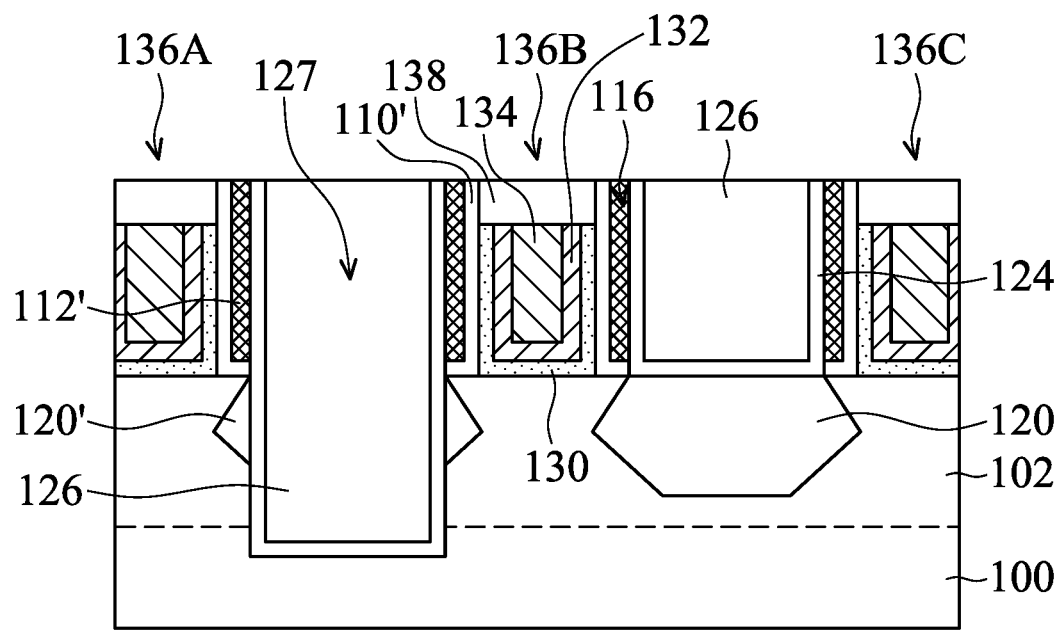
Figure 1L:
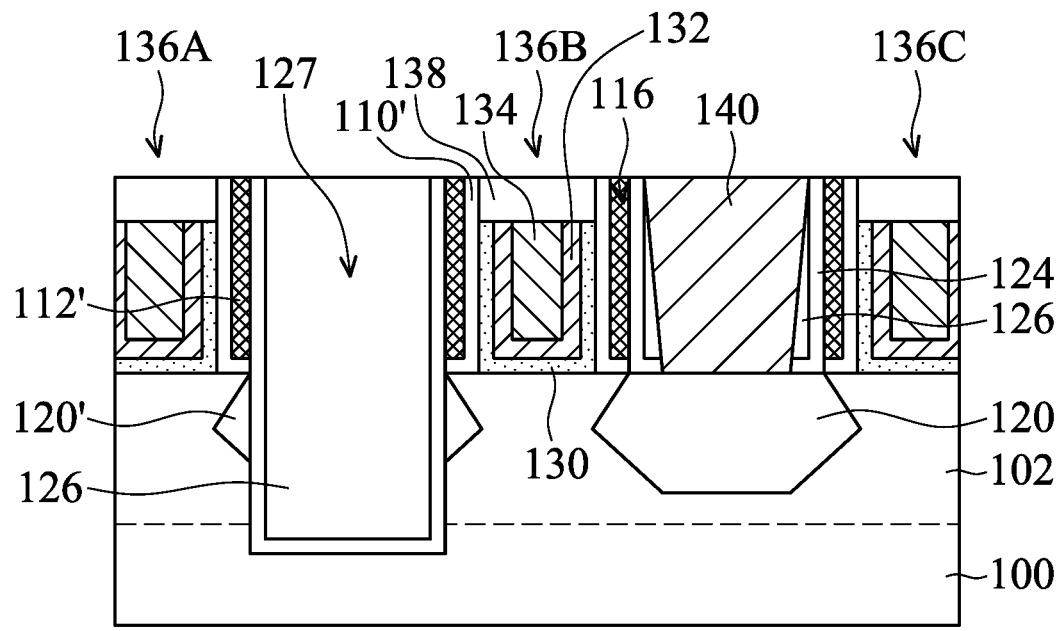
Figure 1M:
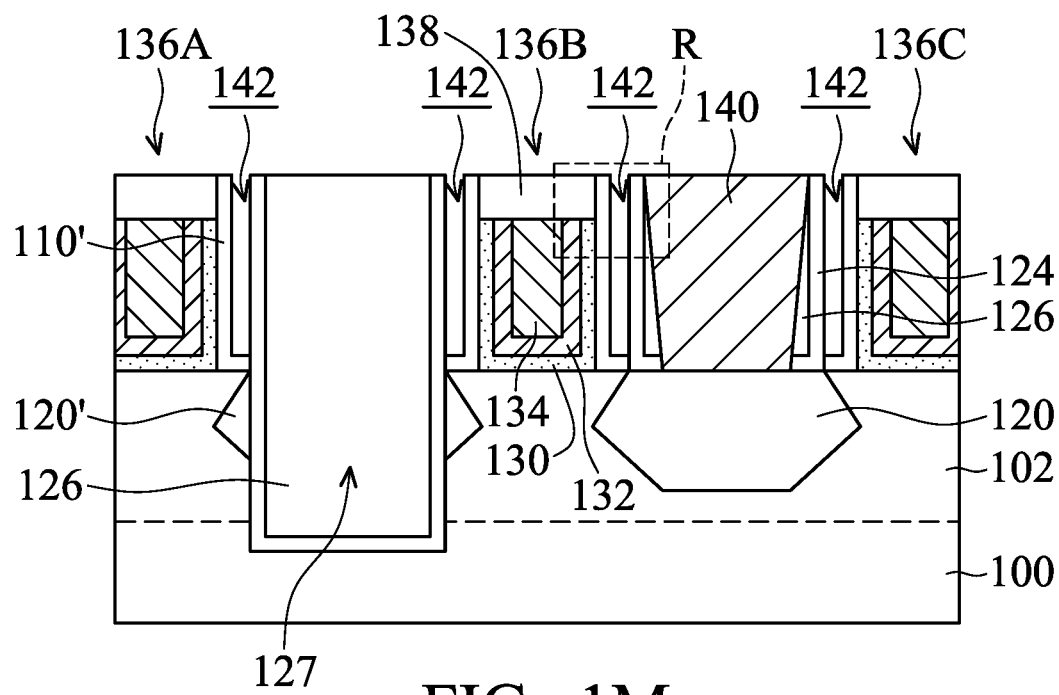
Figure 1N:
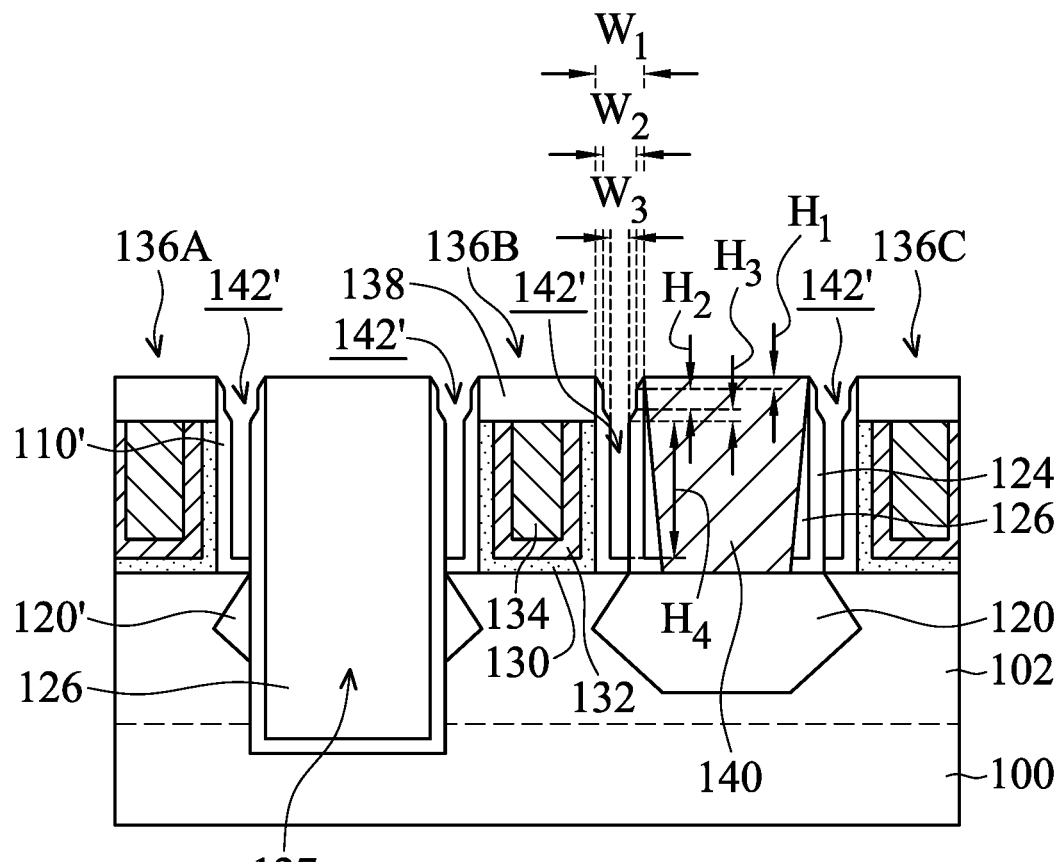
Figure 1O:
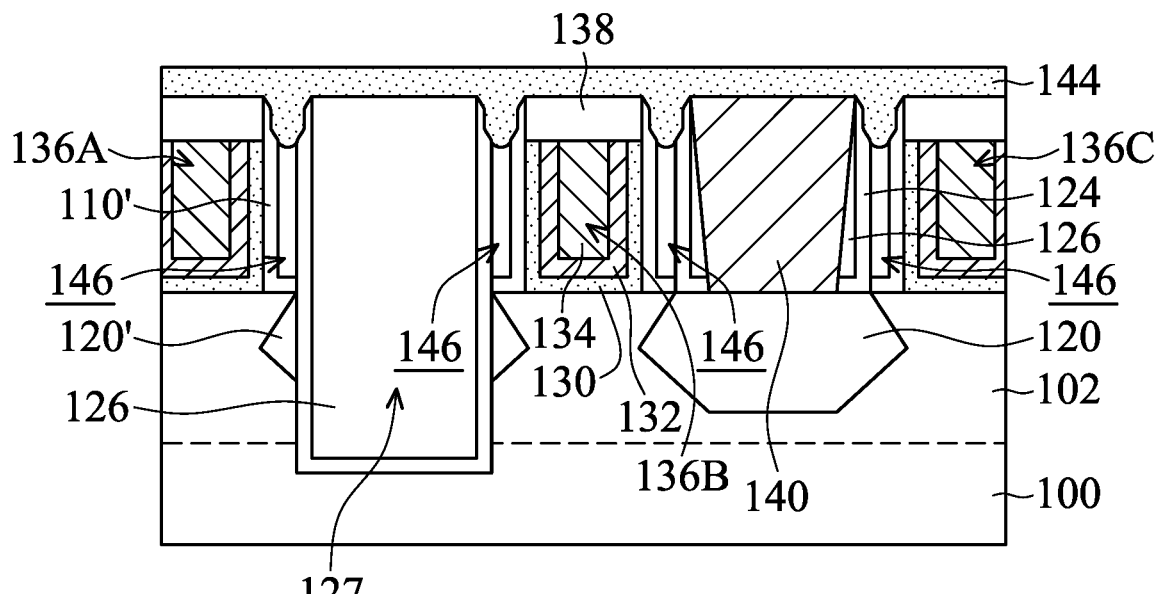
Figure 1P:
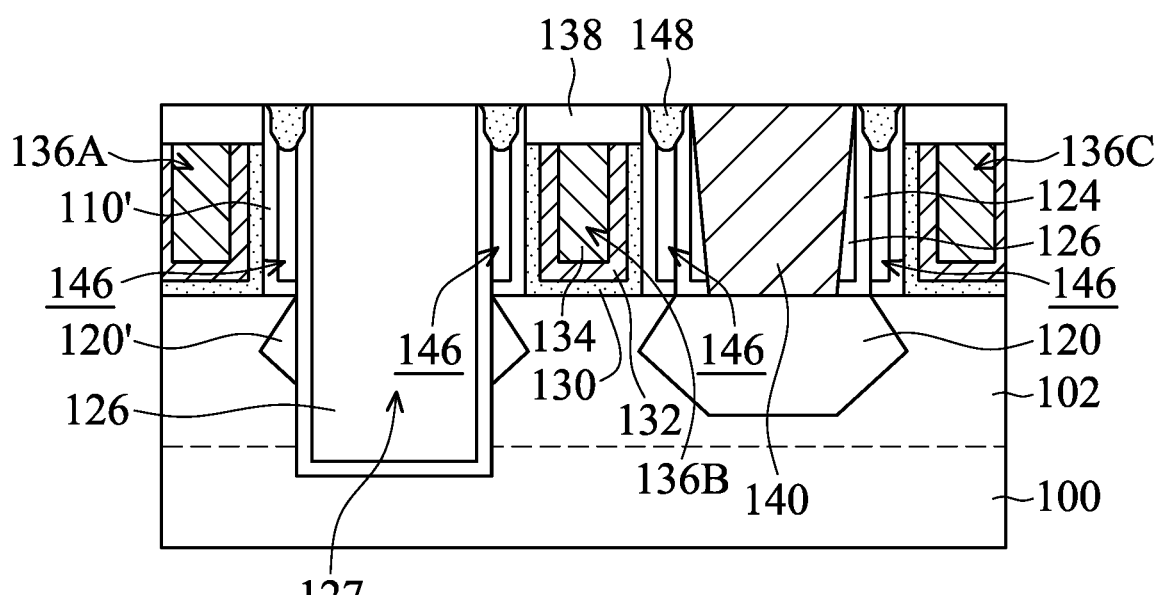
Figure 1Q:
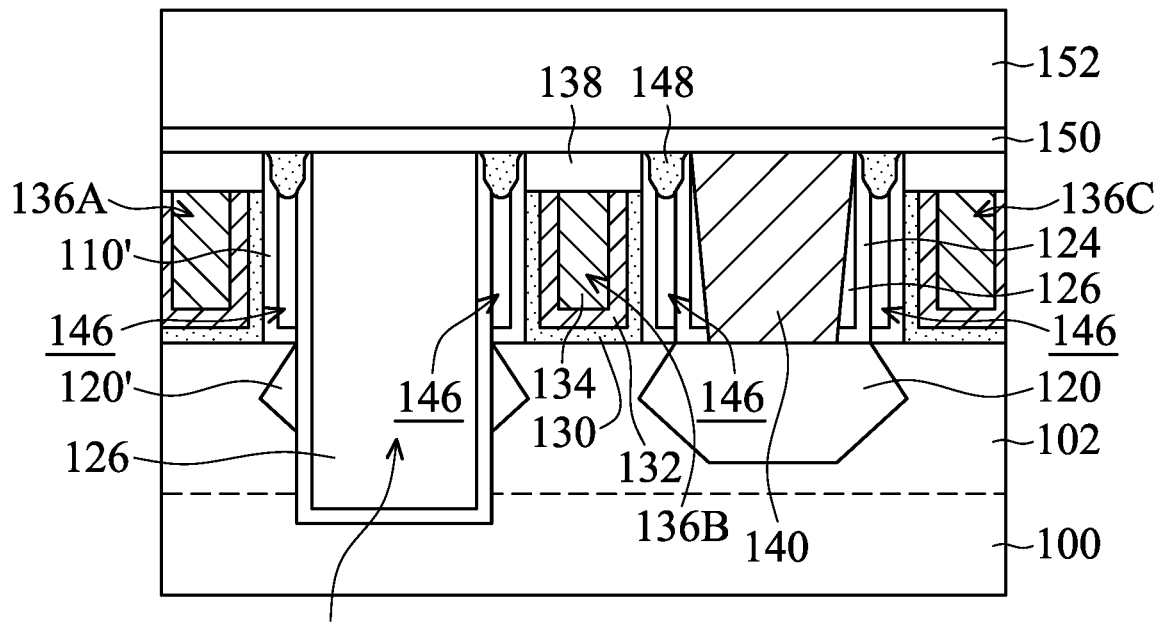
Figure 1R:
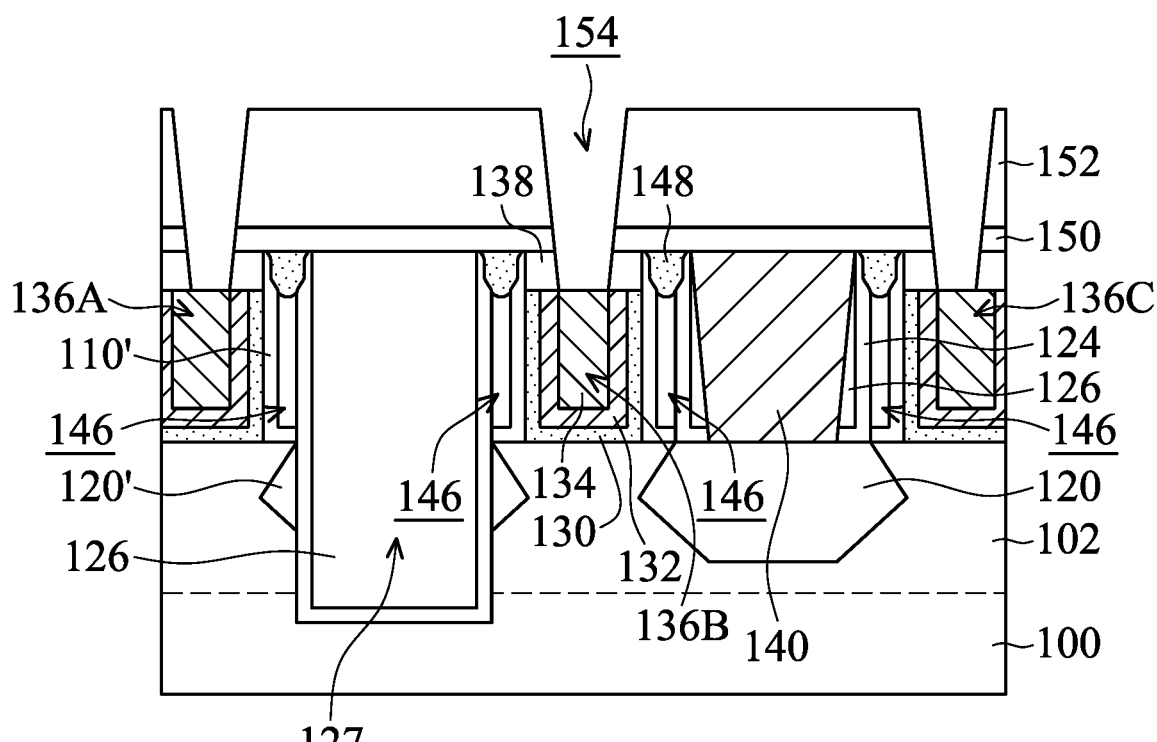
Figure 1S:
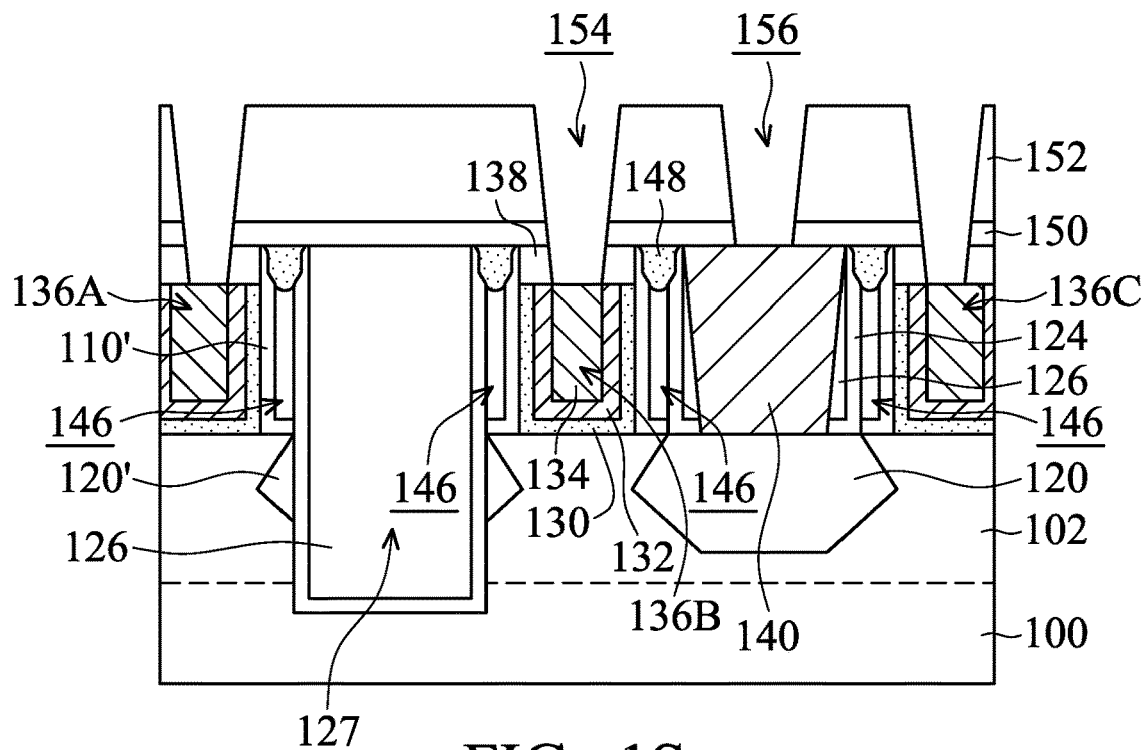
Figure 1T:
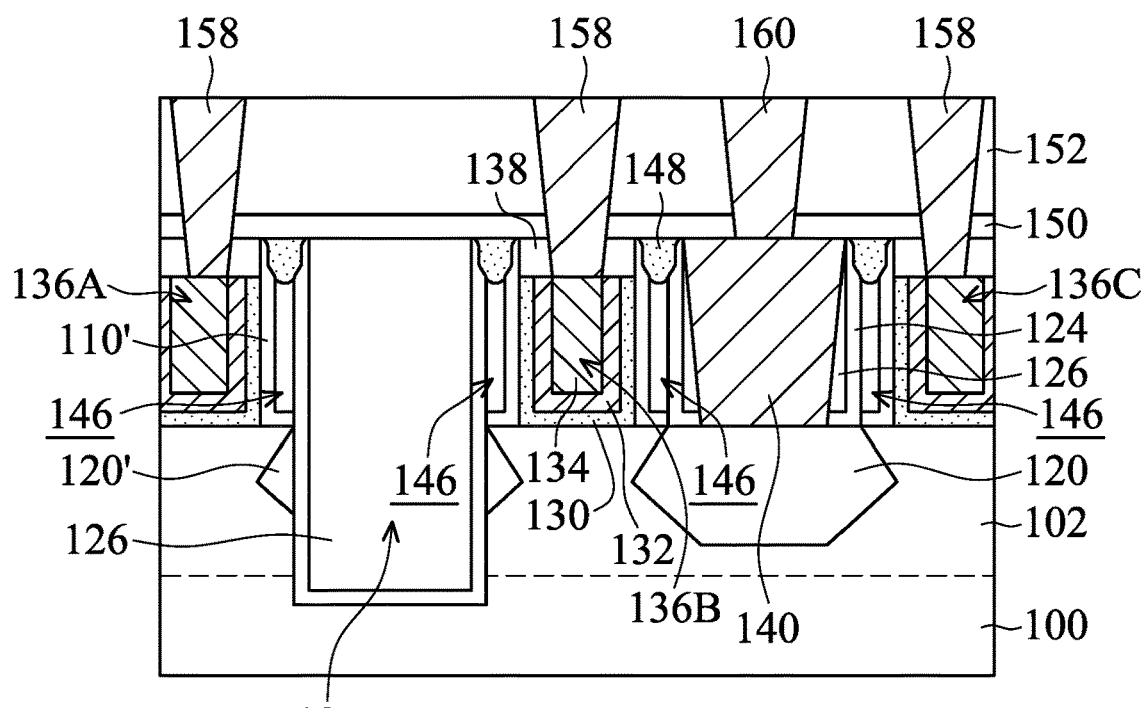

FIGS. 1A-1T are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, one or multiple fin structures are formed. As shown in FIG. 1A, one of the fin structures (the fin structure 102) is shown. In some embodiments, multiple recesses (or trenches) (not shown) are formed in the semiconductor substrate 100. As a result, multiple fin structures including the fin structure 102 are formed between the recesses. In some embodiments, one or more photolithography and etching processes are used to form the recesses.

In some embodiments, isolation features (not shown) are formed in the recesses to surround a lower portion of the fin structure 102. The isolation features are used to define and electrically isolate various device elements formed in and/or over the semiconductor substrate 100. In some embodiments, the isolation features include shallow trench isolation (STI) features, local oxidation of silicon (LOCOS) features, other suitable isolation features, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, one or more other suitable materials, or a combination thereof.

In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features. In some other embodiments, the STI liner is not formed. In these cases, the isolation features may be in direct contact with the fin structures.

In some embodiments, a dielectric material layer is deposited over the semiconductor substrate 100. The dielectric material layer covers the fin structures including the fin structure 102 and fills the recesses between the fin structures. In some embodiments, the dielectric material layer is deposited using a chemical vapor deposition (CVD) process, a flowable chemical vapor deposition (FCVD) process, an atomic layer deposition (ALD) process, a plasma enhanced chemical vapor deposition (PECVD) process, a spin coating process, one or more other applicable processes, or a combination thereof.

In some embodiments, a planarization process is then used to thin down the dielectric material layer to expose the fin structure 102 (or a hard mask element on the fin structure 102). The planarization process may include a chemical mechanical polishing (CMP) process, a grinding process, an etching process, a dry polishing process, one or more other applicable processes, or a combination thereof. Afterwards, the dielectric material layer is etched back to below the top of the fin structure 102. As a result, the isolation features are formed. The fin structures including the fin structure 102 protrude from the top surfaces of the isolation features.

As shown in FIG. 1A, multiple gate stacks including gate stacks 104A, 104B, and 104C are formed over the semiconductor substrate 100, in accordance with some embodiments. The gate stacks 104A, 104B, and 104C cover portions of the fin structure 102. In some embodiments, the gate stack 104A, 104B, and 104C wrap around side surfaces and a top surface of the fin structure 102 and further extend over the semiconductor substrate 100. The portions of the fin structure 102 under the gate stacks 104A, 104B, and 104C may serve as one or more channel regions of one or more transistors that will be formed.

In some embodiments, the gate stacks 104A, 104B, and 104C are dummy gate stacks and will be replaced with new gate stacks such as metal gate stacks. Each of the gate stacks 104A, 104B, and 104C includes a dummy gate dielectric layer 106 and a dummy gate electrode 108, as shown in FIG. 1A.

In some embodiments, a gate dielectric material layer used for forming the dummy gate dielectric layer 106 is deposited over the semiconductor substrate 100 to cover the fin structure 102 and the isolation features between the fin structures. In some embodiments, the gate dielectric material layer is made of or includes silicon oxide. In some embodiments, the gate dielectric material layer is deposited using a thermal oxidation process, a CVD process, an ALD process, a PECVD process, one or more other applicable processes, or a combination thereof.

Afterwards, a gate electrode layer used for forming the dummy gate electrodes 108 is deposited over the gate dielectric material layer to cover a portion of the fin structure 102, as shown in FIG. 1A in accordance with some embodiments. In some embodiments, the gate electrode layer is made of a semiconductor material such as polysilicon. In some embodiments, the gate electrode layer is deposited over the gate dielectric material layer using a CVD process or one or more other applicable processes.

Afterwards, a patterned hard mask layer (not shown) is formed over the gate electrode layer, in accordance with some embodiments. The patterned hard mask layer is used to assist in patterning the gate electrode layer into the dummy gate electrodes 108. In some embodiments, the gate dielectric material layer is also patterned to form the dummy gate dielectric layer 106, as shown in FIG. 1A.

As shown in FIG. 1B, an inner spacer layer 110 is deposited over the top surfaces and sidewalls of the dummy gate stacks 104A, 104B, and 104C, in accordance with some embodiments. In some embodiments, the inner spacer layer 110 further extends over the fin structure 102. In some embodiments, the inner spacer layer 110 has a dielectric constant that is smaller than the dielectric constant of silicon nitride. The inner spacer layer 110 may be made of or include carbon-containing silicon oxide, carbon-containing silicon oxynitride, one or more other suitable materials, or a combination thereof. The thickness of the inner spacer layer 110 may be in a range from about 2 nm to about 3 nm. The inner spacer layer 110 may be deposited using a CVD process, an ALD process, a PECVD process, one or more other applicable processes, or a combination thereof.

Afterwards, a dummy spacer layer 112 is deposited over the inner spacer layer 110, as shown in FIG. 1B in accordance with some embodiments. In some embodiments, the dummy spacer layer 112 is made of a material having a high etching selectivity with respect to the inner spacer layer 110. In some embodiments, the dummy spacer layer 112 is made of a semiconductor material. The dummy spacer layer 112 may be made of or include silicon, silicon germanium, one or more other suitable materials, or a combination thereof. In some embodiments, the dummy spacer layer 112 is made of a semiconductor material doped with suitable dopants such as boron. The dopants may help the dummy spacer layer 112 to sustain some subsequent processes such as the subsequent removal of the dummy gate stacks 104A, 104B, and 104C. The thickness of the dummy spacer layer 112 may be in a range from about 2 nm to about 3 nm. The dummy spacer layer 112 may be deposited using a CVD process, an ALD process, a PECVD process, one or more other applicable processes, or a combination thereof.

As shown in FIG. 1C, the inner spacer layer 110 and the dummy spacer layer 112 are partially removed, in accordance with some embodiments. The remaining portions of the inner spacer layer 110 and the dummy spacer layer 112 over the sidewalls of the dummy gate stacks 104A, 104B, and 104C form spacer elements 116. In some embodiments, an anisotropic etching process is used to partially remove the inner spacer layer 110 and the dummy spacer layer 112 and form the spacer elements 116. Each of the spacer elements 116 includes an inner spacer 110' formed from a remaining portion of the inner spacer layer 110 and a dummy spacer 112' formed from a remaining portion of the dummy spacer layer 112.

As shown in FIG. 1D, the fin structure 102 is partially removed to form cavities 118, in accordance with some embodiments. The cavities 118 are used to contain epitaxial structures that will be grown later. In some embodiments, the cavities 118 laterally extend so that portions of the cavities 118 are directly below the spacer elements 116 and the dummy gate stacks 104A, 104B, and 104C. With the dummy gate stacks 104A, 104B, and 104C and the spacer elements 116 as an etching mask, an etching process may be used to partially remove the fin structure 102. As a result, the cavities 118 are formed.

As shown in FIG. 1E, epitaxial structures 120 are formed in the cavities 118, in accordance with some embodiments. In some embodiments, the top surfaces of the epitaxial structures 120 are substantially level with the top surface of the fin structure 102. In some other embodiments, the top surfaces of the epitaxial structures 120 are at a height level that is higher than the top surface of the fin structure 102. The epitaxial structures 120 may function as source/drain structures.

In some embodiments, the epitaxial structures 120 are p-type regions. For example, the epitaxial structures 120 may include epitaxially grown silicon germanium or epitaxially grown silicon. In some other embodiments, the epitaxial structures 120 are n-type regions. The epitaxial structures 120 may include epitaxially grown silicon, epitaxially grown silicon carbide (SiC), epitaxially grown silicon phosphide (SiP), or another suitable epitaxially grown semiconductor material.

In some embodiments, the epitaxial structures 120 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 120 are doped with one or more suitable dopants. For example, the epitaxial structures 120 are doped with boron (B), indium (In), or another suitable dopant. Alternatively, in some other embodiments, the epitaxial structures 120 are doped with phosphor (P), antimony (Sb), or another suitable dopant.

In some embodiments, the epitaxial structures 120 are doped in-situ during their epitaxial growth. In some other embodiments, the epitaxial structures 120 are not doped during the growth of the epitaxial structures 120. Instead, after the formation of the epitaxial structures 120, the epitaxial structures 120 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 120 are further exposed to one or more annealing processes to activate the dopants. For example, a rapid thermal annealing process is used.

As shown in FIG. 1F, an opening 122 is formed to cut through the fin structure 102, in accordance with some embodiments. The opening 122 may be used to electrically isolate nearby device elements. One or more photolithography processes and one or more etching processes may be used to form the opening 122. A portion of the epitaxial structure 120 between the dummy gate stacks 104A and 104B is removed. In some embodiments, remaining portions of the epitaxial structure 120 near the opening 122 form epitaxial elements 120', as shown in FIG. 1F.

However, many variations and/or modifications can be made to embodiments of the disclosure. In some other embodiments, the opening 122 is not formed.

As shown in FIG. 1G, an etch stop layer 124 is deposited over the structure shown in FIG. 1F, in accordance with some embodiments. The etch stop layer 124 may be formed with a substantially conformal profile. In some embodiments, the etch stop layer 124 has a dielectric constant that is greater than the dielectric constant of the inner spacer 110'. The etch stop layer 124 may be made of or include silicon nitride, silicon oxynitride, one or more other suitable materials, or a combination thereof. The thickness of the etch stop layer 124 may be in a range from about 2 nm to about 3 nm. The etch stop layer 124 may be deposited using a CVD process, an ALD process, a PECVD process, one or more other applicable processes, or a combination thereof.

Many variations and/or modifications can be made to embodiments of the disclosure. In some other embodiments, the etch stop layer 124 is not formed.

Afterwards, a dielectric layer 126 is deposited over the etch stop layer 124, as shown in FIG. 1G in accordance with some embodiments. The dielectric layer 126 surrounds the fin structure 102, the dummy gate stacks 104A, 104B, and 104C, the epitaxial structures 120, and the spacer elements 116. The dielectric layer 126 fills the opening 122.

The dielectric layer 126 may be made of or include carbon-containing silicon oxide, silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 126 is deposited using a FCVD process, a CVD process, an ALD process, a PECVD process, a spin coating process, one or more other applicable processes, or a combination thereof.

As shown in FIG. 1H, a planarization process is used to partially remove the dielectric layer 126 and the etch stop layer 124 to expose the dummy gate stacks 104A, 104B, and 104C, in accordance with some embodiments. The planarization process may include a CMP process, a grinding process, an etching process, a dry polishing process, one or more other applicable processes, or a combination thereof. The portion of the dielectric layer 126 that remains in the opening 122 forms an isolation structure 127. The isolation structure 127 may be used to electrically isolate nearby device elements.

Many variations and/or modifications can be made to embodiments of the disclosure. In some other embodiments, the opening 122 and the isolation structure 127 are not formed. Other isolation structures may be formed earlier or later to electrically isolate some of the nearby device elements.

As shown in FIG. 1I, the dummy gate stacks 104A, 104B, and 104C are removed to form trenches 128, in accordance with some embodiments. The trenches 128 are surrounded by the dielectric layer 126. One or more etching processes may be used to remove the dummy gate stacks 104A, 104B, and 104C. As mentioned above, in some embodiments, the dummy spacer layer 112 is doped with dopants such as boron. Therefore, the etching selectivity between the dummy spacers 112' and the dummy gate electrodes 108 is increased. Therefore, the dummy spacers 112' may not be etched or removed (or merely slightly etched or removed) during the removal of the dummy gate stacks 104A, 104B, and 104C at this stage.

As shown in FIG. 1J, metal gate stacks 136A, 136B, and 136C are formed in the trenches 128, in accordance with some embodiments. Each of the metal gate stacks 136A, 136B, and 136C includes a gate dielectric layer 130, a work function layer 132, and a conductive filling layer 134.

In some embodiments, multiple metal gate stack layers are formed over the structure shown in FIG. 1I to overfill the trenches 128. The metal gate stack layers include the gate dielectric layer 130, the work function layer 132, and the conductive filling layer 134. One or more other layers may be formed between the metal gate stack layers mentioned above. A barrier layer may be formed between the gate dielectric layer 130 and the work function layer 132. A blocking layer may be formed between the work function layer 132 and the conductive filling layer 134.

In some embodiments, the gate dielectric layer 130 is made of or includes a dielectric material with high dielectric constant (high-K). The gate dielectric layer 130 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof.

In some embodiments, the gate dielectric layer 130 deposited over the sidewalls and bottoms of the trenches 128. In some embodiments, before the formation of the gate dielectric layer 130, a thermal oxidation operation is performed to form an interfacial layer over the exposed surface of the fin structure 102. The interfacial layer may help to improve adhesion between the fin structure 102 and the gate dielectric layer 130. The gate dielectric layer 130 may be deposited using an ALD process, a CVD process, a PECVD process, one or more other applicable processes, or a combination thereof. In some embodiments, the formation of the gate dielectric layer 130 involves a thermal operation.

The work function layer 132 may be used to provide the desired work function for transistors to enhance device performance. In some embodiments, the work function layer 132 is used for forming an NMOS device. The work function layer 132 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 132 is used for forming a PMOS device. The work function layer 132 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer 132 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 132 may be adjusted to fine-tuned the work function level. For example, a titanium nitride layer may be used as a p-type work function layer or an n-type work function layer, depending on the thickness and/or the composition of the titanium nitride layer.

The work function layer 132 may be deposited over the gate dielectric layer 130 using an ALD process, a CVD process, a PVD process, an electroplating process, an electroless plating process, one or more other applicable processes, or a combination thereof.

In some embodiments, a barrier layer is formed before the work function layer 132 to interface the gate dielectric layer 130 with the subsequently formed work function layer 132. The barrier layer may also be used to prevent diffusion between the gate dielectric layer 130 and the subsequently formed work function layer 132. The barrier layer may be made of or include a metal-containing material. The metal-containing material may include titanium nitride, tantalum nitride, one or more other suitable materials, or a combination thereof. The barrier layer may be deposited using an ALD process, a CVD process, a PECVD process, a PVD process, an electroplating process, an electroless plating process, one or more other applicable processes, or a combination thereof.

In some embodiments, the conductive filling layer 134 is made of or includes a metal material. The metal material may include tungsten, aluminum, copper, cobalt, one or more other suitable materials, or a combination thereof. The conductive filling layer 134 may be deposited over the work function layer 132 to overfill the trenches 128. The conductive filling layer may be deposited using a CVD process, an ALD process, a PVD process, a PECVD process, an electroplating process, an electroless plating process, a spin coating process, one or more other applicable processes, or a combination thereof.

In some embodiments, a blocking layer is formed over the work function layer 132 before the formation of the conductive filling layer 134. The blocking layer may be used to prevent the subsequently formed conductive filling layer 134 from diffusing or penetrating into the work function layer 132. The blocking layer may be made of or include tantalum nitride, titanium nitride, one or more other suitable materials, or a combination thereof. The blocking layer may be deposited using an ALD process, a PVD process, a CVD process, a PECVD process, an electroplating process, an electroless plating process, one or more other applicable processes, or a combination thereof.

Afterwards, a planarization process is performed to remove the portions of the metal gate stack layers outside of the trenches 128, as shown in FIG. 1J in accordance with some embodiments. As a result, the metal gate stacks 136A, 136B, and 136C are formed. In some embodiments, the top surfaces of the metal gate stacks 136A, 136B, and 136C are substantially coplanar with the top surface of the dielectric layer 126. The planarization process may include a CMP process, a grinding process, an etching process, a dry polishing process, one or more other applicable processes, or a combination thereof.

As shown in FIG. 1K, upper portions of the metal gate stacks 136A, 136B, and 136C are removed to form recesses above the metal gate stacks 136A, 136B, and 136C, in accordance with some embodiments. One or more etching back processes may be used to form the recesses. Afterwards, protective elements 138 are formed in the recesses, as shown in FIG. 1K in accordance with some embodiments. The protective elements 138 may protect the metal gate stacks 136A, 136B, and 136C during subsequent processes such as the formation process of conductive contacts.

The protective elements 138 may be made of or include silicon nitride, silicon oxynitride, carbon-containing silicon nitride, carbon-containing silicon oxynitride, carbon-containing silicon oxide, one or more other suitable materials, or a combination thereof. In some embodiments, one or more dielectric material layers are deposited to overfill the recesses formed after the etching back of the metal gate stacks 136A, 136B, and 136C. The dielectric material layers may be deposited using a CVD process, an ALD process, a FCVD process, one or more other applicable processes, or a combination thereof. Afterwards, a planarization process is used to remove the portion of the dielectric material layers outside of the recesses. As a result, the remaining portions of the dielectric material layers in the recesses form the protective elements 138. The planarization process may include a CMP process, a grinding process, an etching process, a dry polishing process, one or more other applicable processes, or a combination thereof.

As shown in FIG. 1L, a conductive contact 140 is formed in the dielectric layer 126, in accordance with some embodiments. The conductive contact 140 further penetrates through the etch stop layer 124 to be electrically connected to the epitaxial structure 120. The conductive contact 140 may be made of or include cobalt, tungsten, ruthenium, aluminum, copper, gold, one or more other suitable materials, or a combination thereof.

In some embodiments, one or more photolithography processes and one or more etching processes are used to form contact holes that expose the epitaxial structure 120. Afterwards, a metal-semiconductor compound region (such as metal silicide region) may be formed on the expose surface of the epitaxial structure 120. The metal-semiconductor compound region may be used to reduce the contact resistance. Barrier layers or barrier regions may be formed along the sidewalls of the contact holes. Then, a conductive material is deposited to overfill the contact holes. In some other embodiments, the conductive material is deposited over the expose surface of the epitaxial structure 120 at an elevated temperature. Once the conductive material comes into contact with the epitaxial structure 120 at an elevated temperature, the metal-semiconductor compound region is formed.

Afterwards, a planarization process is performed to remove the portion of the conductive material outside of the contact holes, in accordance with some embodiments. As a result, the remaining portion of the conductive material inside the contact hole forms the conductive contact 140, as shown in FIG. 1L. The planarization process may include a CMP process, a grinding process, an etching process, a dry polishing process, one or more other applicable processes, or a combination thereof.

As shown in FIG. 1M, the dummy spacers 112' formed from the dummy spacer layer 112 are removed, in accordance with some embodiments. As a result, recesses 142 are formed between the inner spacers 110' and the dielectric layer 126. In some embodiments, the dummy spacers 112' are removed using a dry etching process. Each of the recesses 142 may have a depth that is in a range from about 20 nm to about 30 nm.

As shown in FIG. 1N, the inner spacers 110' and/or the etch stop layer 124 are partially removed, in accordance with some embodiments. As a result, the upper portions of the recesses 142 are enlarged to be recesses 142', as shown in FIG. 1N. In some embodiments, one or more etching processes are used to laterally etch the inner spacers 110' and/or the etch stop layer 124, so as to enlarge the recesses, which facilitates a subsequent formation of sealing elements.

Figure 2A:
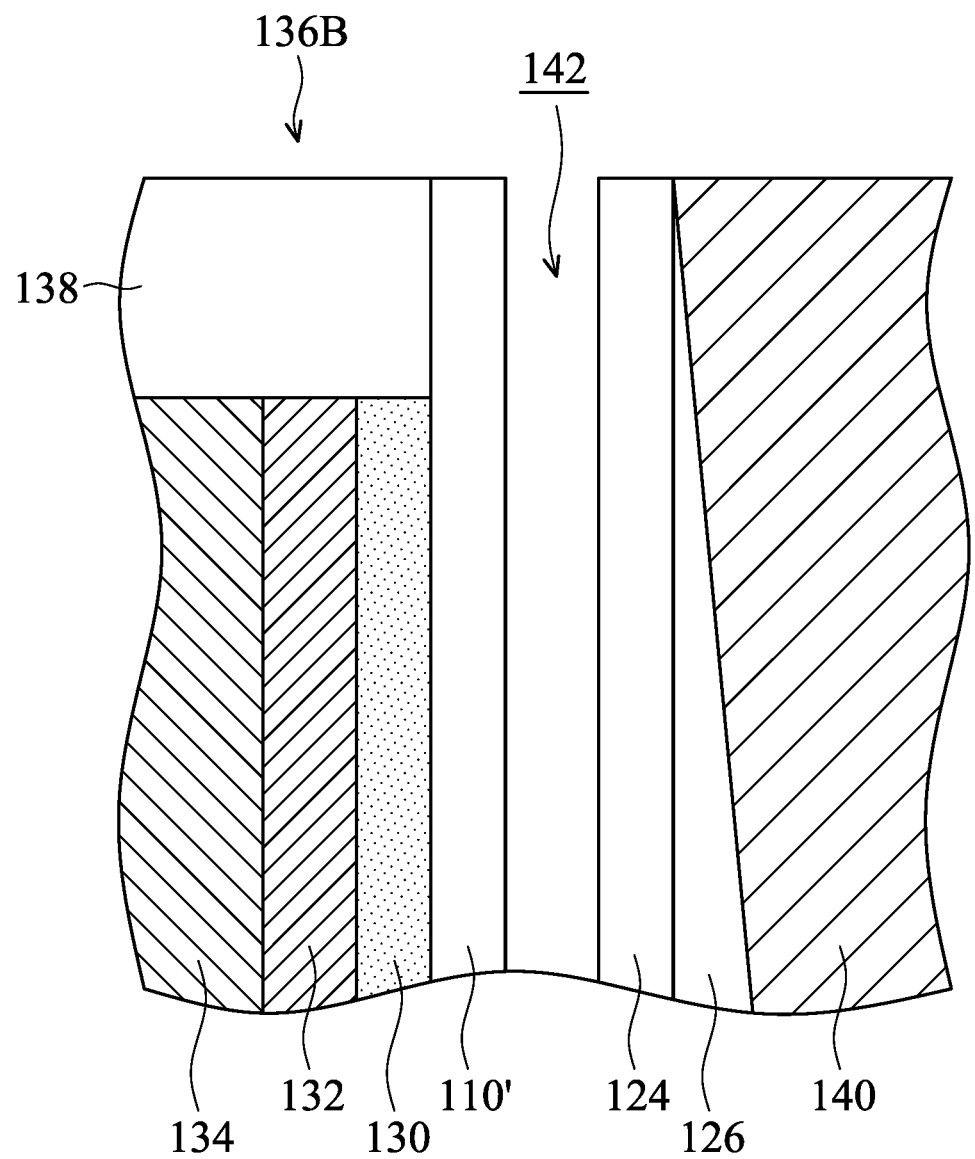
FIGS. 2A-2G are cross-sectional views of various stages of a process for forming a semiconductor device structure, in accordance with some embodiments.
Figure 2B:
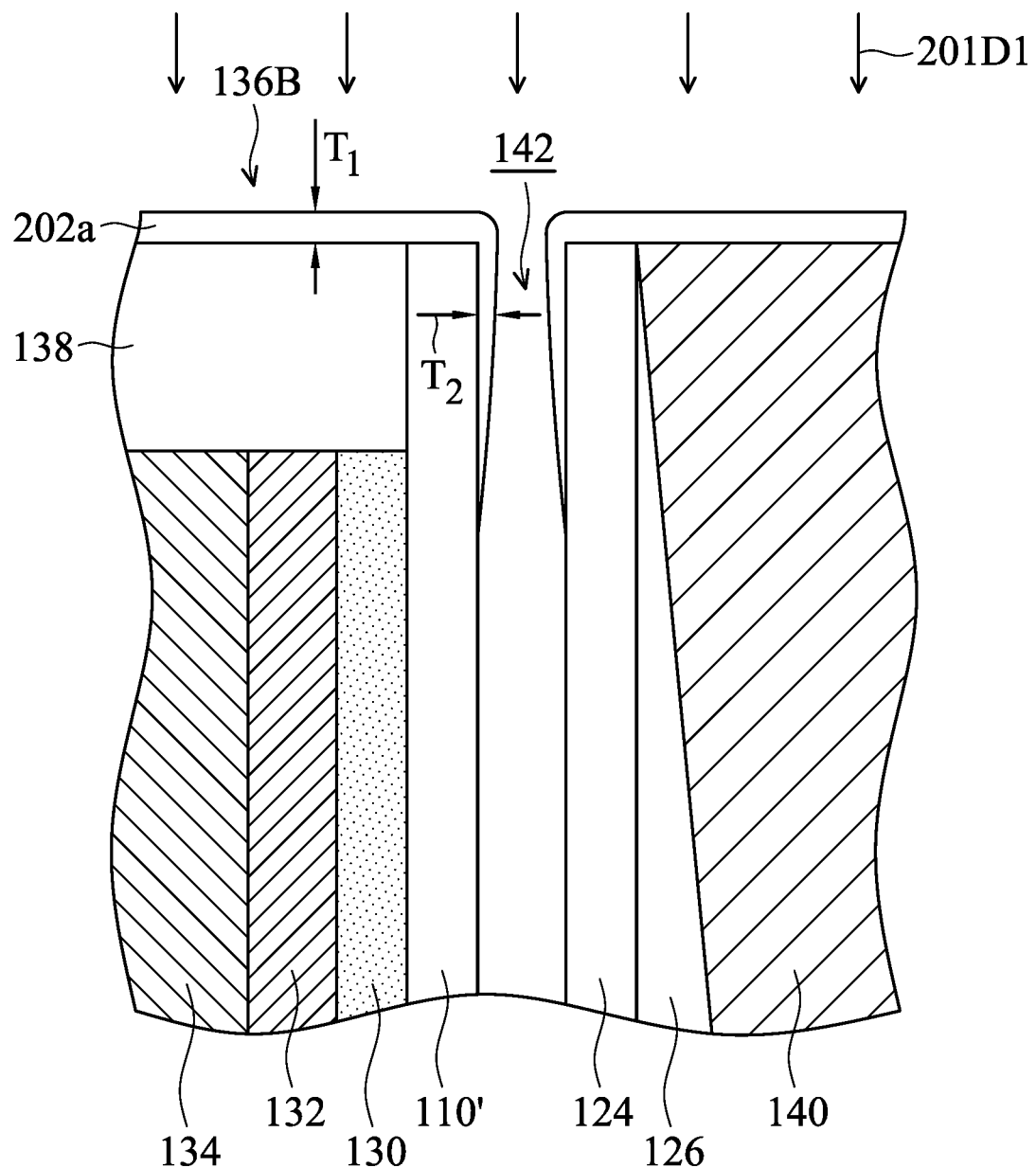
Figure 2C:
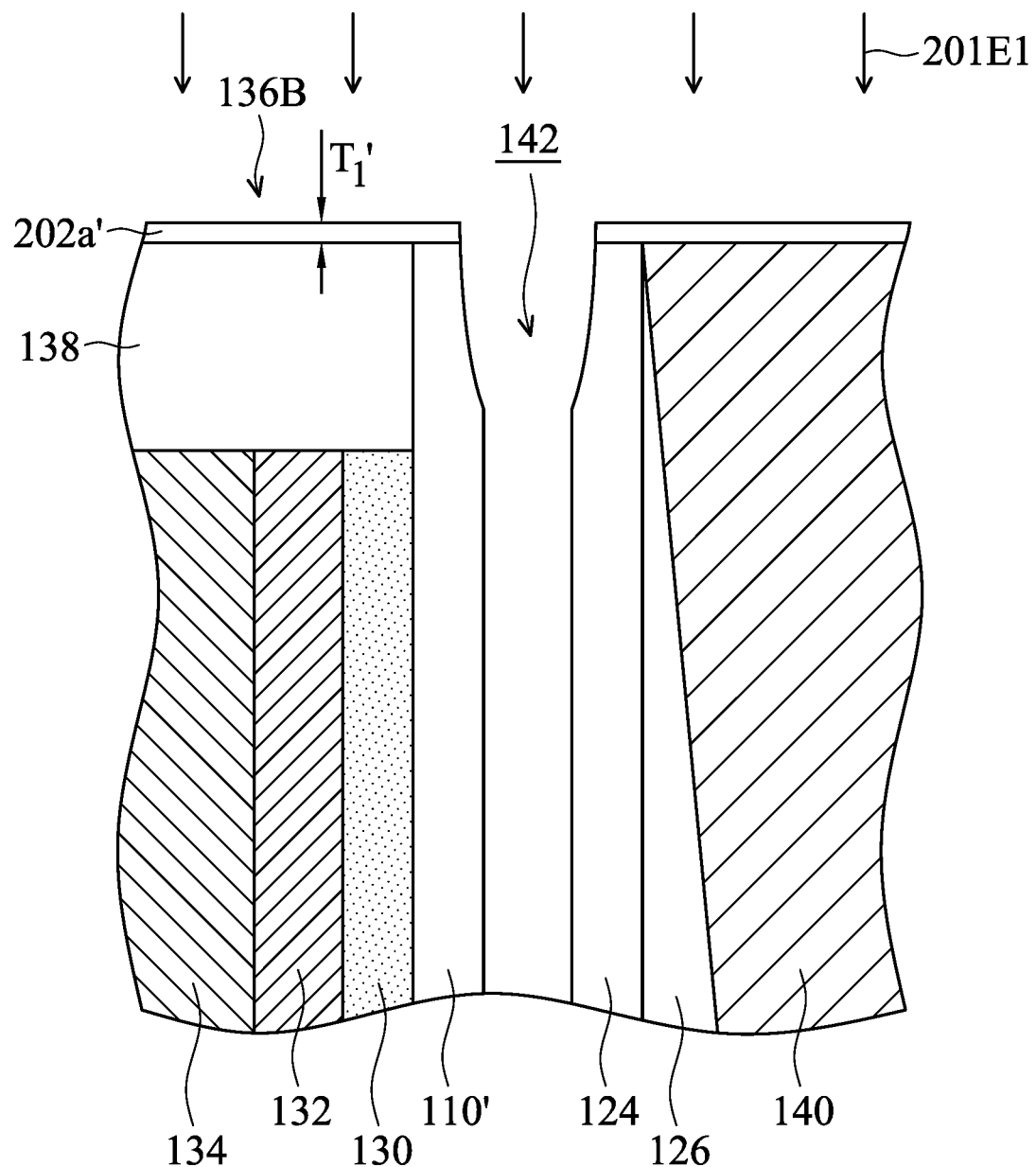
Figure 2D:
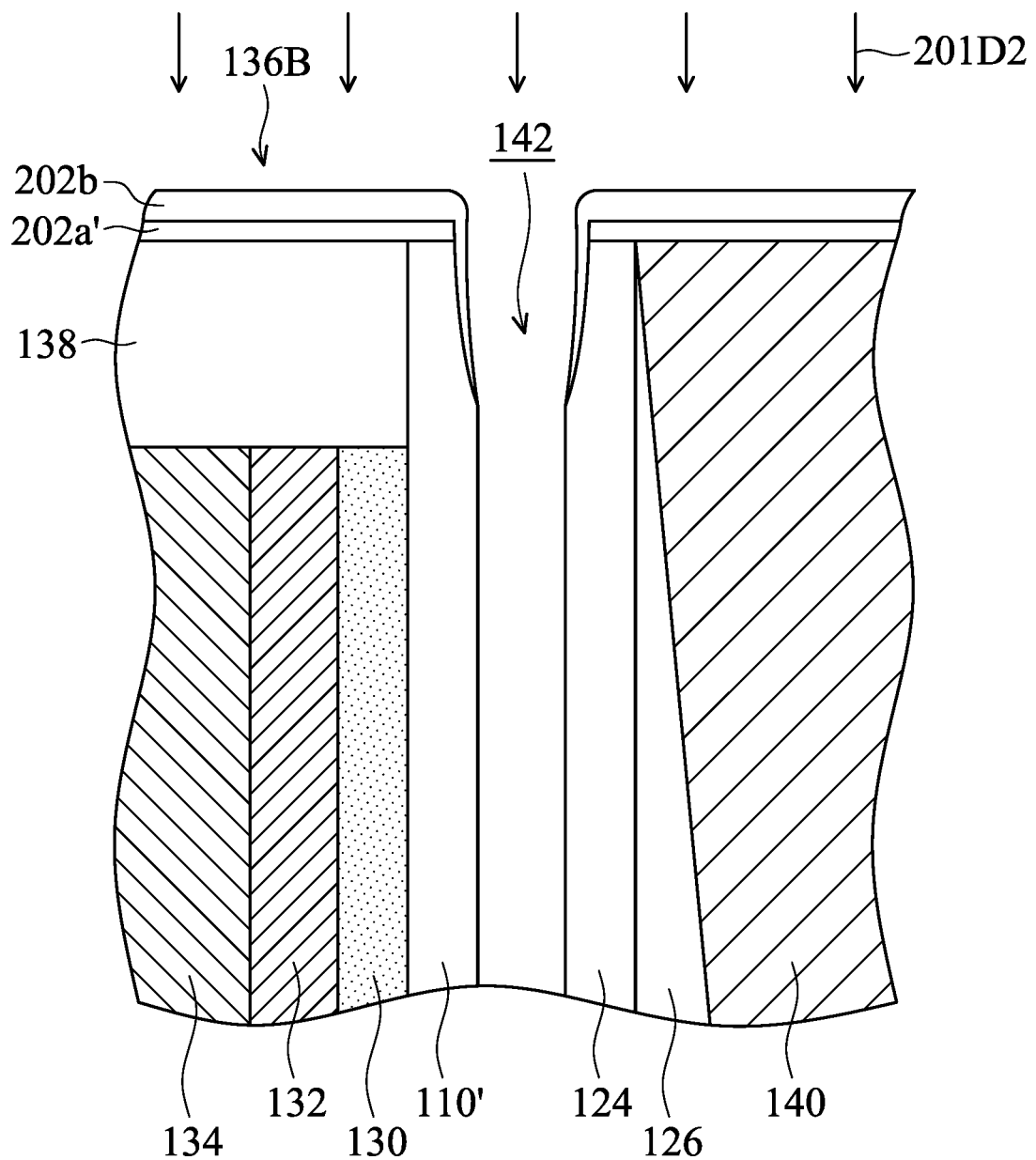
Figure 2E:
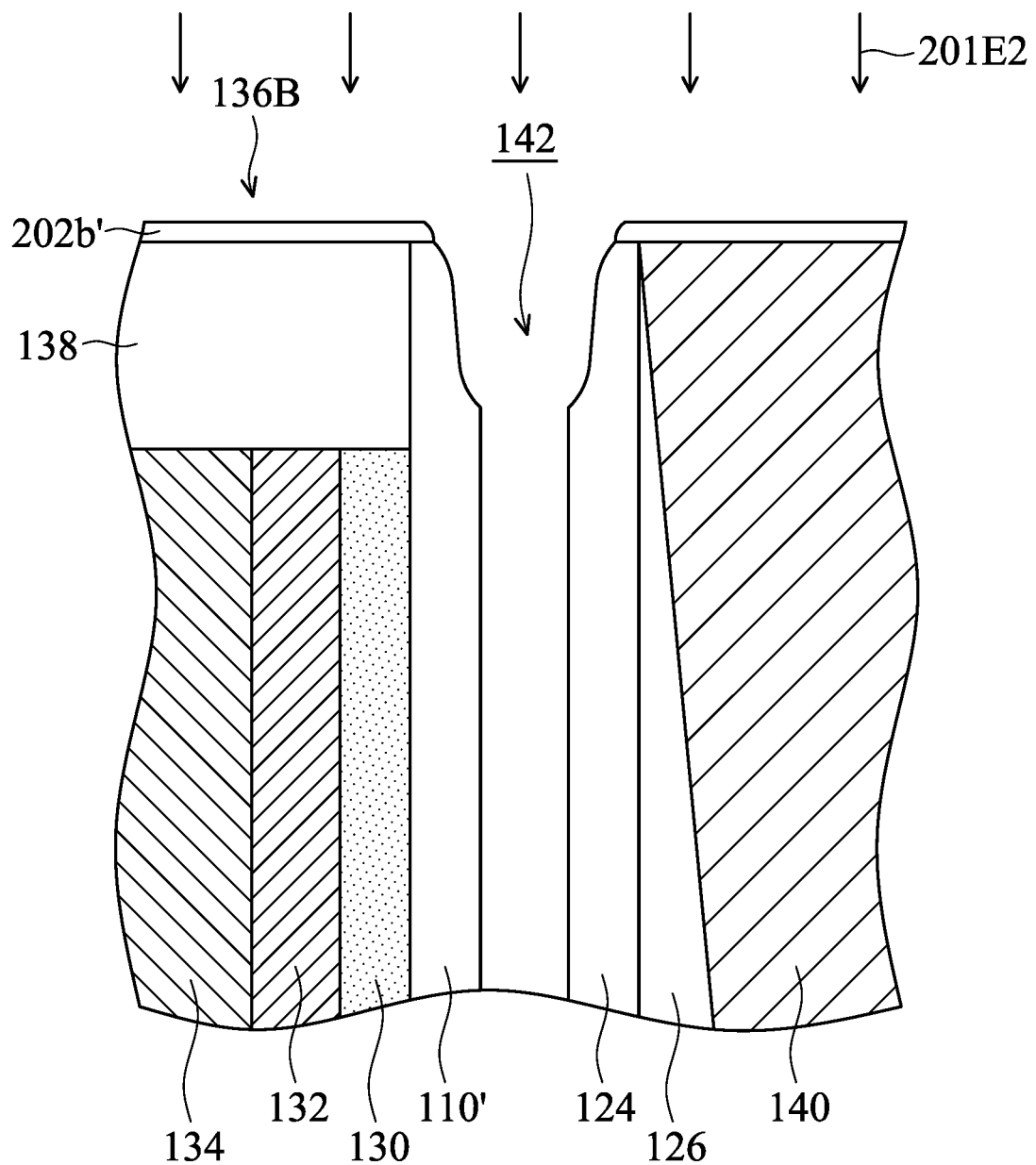
Figure 2F:
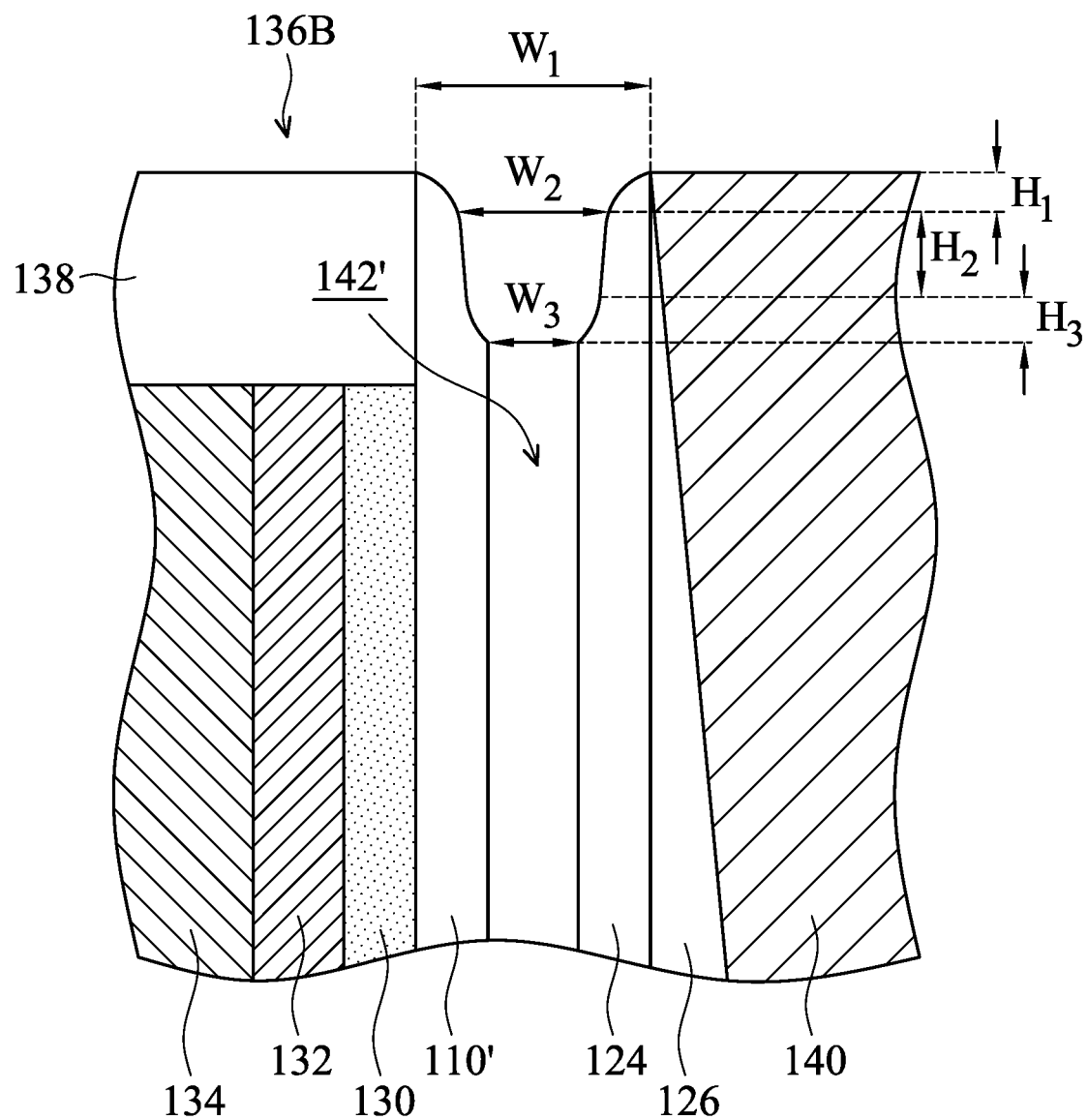
Figure 2G:
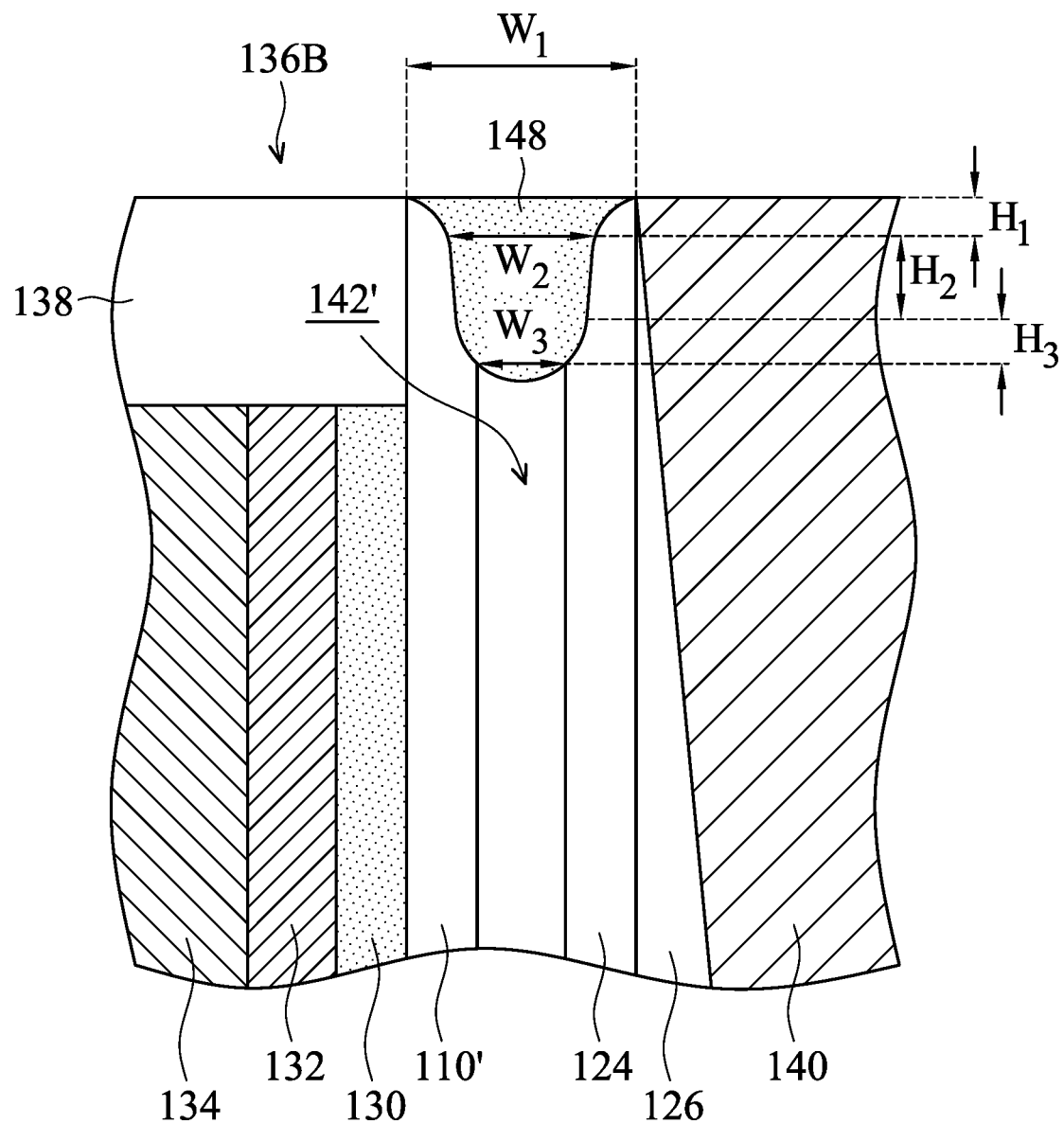

FIGS. 2A-2G are cross-sectional views of various stages of a process for forming a semiconductor device structure, in accordance with some embodiments. FIGS. 2A-2F show various stages of a process for enlarging the recess 142 to be the recess 142', in accordance with some embodiments. In some embodiments, FIG. 2A in an enlarged cross-sectional view partially showing the region R in FIG. 1M. FIG. 2G shows a subsequent process stage of forming a sealing element in the recess 142', in accordance with some embodiments.

As shown in FIG. 2B, a first protection layer 202a is formed over the inner spacer 110' and the metal gate stack 136B, in accordance with some embodiments. The first protection layer 202a also extends over the etch stop layer 124, the dielectric layer 126 and the conductive contact 140. A portion of the first protection layer 202a extends into the recess 142 and partially covers the sidewall of the recess 142.

As shown in FIG. 2B, the portion of the first protection layer 202a covering the top surfaces of the inner spacer 110' and the metal gate stack 136B has a first thickness $T_1$. The portion of the first protection layer 202a partially covering the sidewall of the recess 142 has a thickness $T_2$. The thickness $T_1$ is greater than the thickness $T_2$.

In some embodiments, the first protection layer 202a is made of or includes a carbon-containing material, a silicon-containing material, one or more other suitable materials, or a combination thereof. In some embodiments, the first protection layer 202a is made of or includes a polymer-containing material.

In some embodiments, a first deposition operation 201D1 is used to deposit a protection material for forming the first protection layer 202a. In some embodiments, the first deposition operation 201D1 involves introducing a first kind of plasma. In some embodiments, the reaction gas mixture used to generate the first kind of plasma includes $CH_4$, $C_4F_6$, $C_4F_8$, $CH_3F$, $SO_2$, $SiCl_4$, $O_2$, one or more other suitable gases, or a combination thereof. In some embodiments, the reaction gas mixture used to generate the first kind of plasma further includes one or more dilute gases. The dilute gases may include Ar, $N_2$, He, $H_2$, one or more other suitable gases, or a combination thereof.

The operation pressure of the first deposition operation 201D1 may be in a range from about 10 mTorr to about 50 mTorr. The operation power used for generating the plasma may be in a range from about 600 W to about 1200 W. The bias power applied to a substrate holder supporting the structure shown in FIG. 2B may be in a range from about 0 W to about 20 W. The flow rate of the reaction gas such as $CH_4$, $C_4F_6$, $C_4F_8$, $CH_3F$, and/or $SO_2$ may be in a range from about 20 sccm to about 200 sccm. The flow rate of the reaction gas such as $SiCl_4$ and/or $O_2$ may be in a range from about 2 sccm to about 60 sccm. The flow rate of the dilute gas(es) may be in a range from about 1000 sccm to about 2000 sccm. The operation temperature is in a range from about 10 degrees C. to about 60 degrees C. The operation time is in a range from about 3 seconds to about 4 seconds. The duty cycle may be in a range from about 10% to about 90%. In some other embodiments, the duty cycle is in a range from about 20% to about 30%.

In some embodiments, since the aspect ratio of the recess 142 is high and the operation time of the first deposition operation 201D1 is short, the plasma used for forming the first protection layer 202a is difficult to enter the recess 142. As a result, the first protection layer 202a may merely cover the upper portion of the sidewall of the recess 142. The portion of the first protection layer 202a extending along the sidewall of the recess 142 is thinner than the portion of the first protection layer 202a extending over the metal gate stack 136B. The thickness variation of different portions of the first protection layer 202a may help to the subsequent lateral sidewall etching of the inner spacer 110' and the etch stop layer 124.

As shown in FIG. 2C, a first etching operation 201E1 is performed on the first protection layer 202a, the inner spacer 110', and the etch stop layer 124, in accordance with some embodiments. The first protection layer 202a is partially removed and becomes a protection layer 202a' with a thickness $T_1'$ that is less than the thickness $T_1$ of the first protection layer 202. In some embodiments, the first etching operation 201E1 is performed in-situ in the same process chamber where the first deposition operation 201D1 is performed without breaking vacuum.

In some embodiments, the first etching operation 201E1 removes the portion of the first protection layer 202a originally over the sidewall of the recess 142 and further laterally removes the inner spacer 110' and the etch stop layer 124 from upper portions of the sidewalls of the inner spacer 110' and the etch stop layer 124. While the first etching operation 201E1 partially removes the inner spacer 110' and the etch stop layer 124, the portion of the first protection layer 202a originally outside of the recess 142 is not completely removed. The first protection layer 202a originally outside of the recess 142 still partially remains as the protection layer 202a' to protect the elements thereunder. Therefore, during the first etching operation 201E1, the elements under the remaining portion of the first protection layer 202a such as protection layer 202a' are protected without being damaged. The protected elements may include the top surfaces of the inner spacer 110' and the etch stop layer, the protective element 138, the dielectric layer 126, the isolation structure, and the conductive contact 140. The first etching operation 201E1 is terminated before the protection layer 202a' is completely removed or consumed to ensure that the elements under the protection layer 202a' are not damaged.

In some embodiments, the first etching operation 201E1 involves introducing a second kind of plasma. In some embodiments, the reaction gas mixture used to generate the second kind of plasma includes $CF_4$, $CHF_3$, one or more other suitable gases, or a combination thereof. In some embodiments, the reaction gas mixture used to generate the second kind of plasma further includes one or more dilute gases. The dilute gases may include Ar, $N_2$, He, $H_2$, one or more other suitable gases, or a combination thereof.

The operation pressure of the first etching operation 201E1 may be in a range from about 50 mTorr to about 100 mTorr. The operation power used for generating the plasma may be in a range from about 400 W to about 1200 W. The bias power applied to the substrate holder supporting the structure shown in FIG. 2C may be in a range from about 0 W to about 30 W. The flow rate of the reaction gas may be in a range from about 20 sccm to about 200 sccm. The flow rate of the dilute gas(es) may be in a range from about 500 sccm to about 2000 sccm. The operation temperature is in a range from about 10 degrees C. to about 60 degrees C. The operation time is in a range from about 3 seconds to about 4 seconds. The duty cycle may be in a range from about 10% to about 80%. In some other embodiments, the duty cycle is in a range from about 20% to about 30%.

As shown in FIG. 2D, before another etching operation is performed to further enlarge the recess 142, a second protection layer 202b is formed over the protection layer 202a', in accordance with some embodiments. The second protection layer 202b extends into the recess 142 to partially covers the sidewalls of the inner spacer 110' and the etch stop layer 124 that were previously etched during the first etching operation 201E1 illustrated in FIG. 2C. In some embodiments, like to the first protection layer 202a, the portion of the second protection layer 202b over the protection layer 202a' is thicker than the portion of the second protection layer 202b extending over the etched sidewalls of the recess 142.

In some embodiments, the second protection layer 202b and the first protection layer 202a are made of the same material. In some embodiments, the second protection layer 202b is formed using a second deposition operation 201D2. The second deposition operation 201D2 may be the same as or similar to the first deposition operation 201D1. Alternatively, the processing parameters and/or the reaction gas mixture of the second deposition operation 201D2 may be fine-tuned or modified to meet requirements. In some embodiments, the second deposition operation 201D2 is performed in-situ in the same process chamber where the first etching operation 201E1 is performed without breaking vacuum.

As shown in FIG. 2E, like the embodiments illustrated in FIG. 2C, a second etching operation 201E2 is performed on the second protection layer 202b, the inner spacer 110', and the etch stop layer 124, in accordance with some embodiments. The second protection layer 202b and/or the protection layer 202a' are partially removed to become a protection layer 202b' that is thinner. In some embodiments, the second etching operation 201E2 is performed in-situ in the same process chamber where the second deposition operation 201D2 is performed without breaking vacuum.

In some embodiments, like the first etching operation 201E1, the second etching operation 201E2 removes the portion of the second protection layer 202b originally over the etched sidewall of the recess 142 and further laterally removes the inner spacer 110' and the etch stop layer 124 to further enlarge the recess 142. While the second etching operation 201E2 partially removes the inner spacer 110' and the etch stop layer 124, the portion of the second protection layer 202b originally outside of the recess 142 and the protection layer 202a' are not completely removed or consumed. The second protection layer 202b originally outside of the recess 142 and the protection layer 202a' still partially remain as the protection layer 202b' to protect the elements thereunder. Therefore, during the second etching operation 201E2, the elements under the protection layer 202a' are protected without being damaged. The second etching operation 201E2 is terminated before the protection layer 202b' is completely removed or consumed to ensure that the elements under the protection layer 202b' are not damaged.

In some embodiments, the first kind of plasma used for performing the deposition operation and the second kind of plasma used for performing the etching operation are alternately and sequentially introduced or provided. In some embodiments, the processes illustrated in FIGS. 2B-2E are repeated multiple times. In some embodiments, the deposition operation and etching operation cycles may be performed in a range from 5 times to 10 times. The upper portion of the recess 142 may gradually become wider and wider. As a result, the recess 142' with the profile shown in FIG. 2F or 1N is formed, in accordance with some embodiments.

As shown in FIGS. 1N and 2F, the recess 142' has a first portion with a height $H_1$. The height $H_1$ may be in a range from about 1 nm to about 3 nm. The first portion has a first width $W_1$ near the top of the recess 142'. In some embodiments, the first width $W_1$ gradually narrows in a direction towards the bottom of the recess 142' to reach a second width $W_2$. The first width $W_1$ may be in a range from about 5.5 nm to about 8 nm. The second width $W_2$ may be in a range from about 4 nm to about 7 nm. In some embodiments, the first portion of the recess 142' has a first inclined sidewall.

As shown in FIGS. 1N and 2F, the recess 142' has a second portion with a height $H_2$. The height $H_2$ may be in a range from about 2 nm to about 8 nm. The width of the second portion is substantially equal to the width $W_2$. In some embodiments, the second portion of the recess 142' has a second inclined sidewall. In some embodiments, the second inclined sidewall of the second portion is steeper than the first inclined sidewall of the first portion. In some embodiments, the second inclined sidewall is a substantially vertical sidewall.

As shown in FIGS. 1N and 2F, the recess 142' has a third portion with a height $H_3$. The height $H_3$ may be in a range from about 2 nm to about 4 nm. In some embodiments, the width of the third portion gradually narrows in a direction towards the bottom of the recess 142' to reach a third width $W_3$. The third width $W_3$ may be in a range from about 2 nm to about 3 nm. In some embodiments, the third portion of the recess 142' has a third inclined sidewall. In some embodiments, the second inclined sidewall of the second portion is steeper than the third inclined sidewall of the third portion.

As shown in FIG. 1N, the recess 142' has a fourth portion with a height $H_4$. The height $H_4$ may be in a range from about 15 nm to about 25 nm. The fourth portion of the recess 142' may be substantially as wide as the lower portion of the recess 142 without being further enlarged.

Many variations and/or modifications can be made to embodiments of the disclosure. In some other embodiments, the recesses 142' are formed using other applicable processes than those illustrated in FIGS. 2A-2F. For example, a mask element is formed over the structure shown in FIG. 1M to protect elements thereunder. Afterwards, one or more etching operations are used to laterally etch the inner spacer 110' and the etch stop layer 124. As a result, an enlarged recess may be obtained. Then, the mask element is removed.

Many variations and/or modifications can be made to embodiments of the disclosure. In some other embodiments, the recesses 142 are not enlarged. Sealing elements may be directly formed over the structure shown in FIG. 1M to seal the recesses 142.

As shown in FIG. 1O, a sealing layer 144 is deposited over the structure shown in FIG. 1N to seal the recesses 142', in accordance with some embodiments. A portion of the sealing layer 144 extends into the recesses 142'. The thickness of the portion of the sealing layer 144 extending into the recesses 142' may be in a range from about 7 nm to about 11 nm.

Due to the profile of the recess 142', the sealing layer 144 may enter the recesses 142' and be controlled to fill the upper portions of the recesses 142' which are enlarged. The lower portions of the recesses 142' are substantially prevented from being occupied by the sealing layer 144. As a result, sealed holes 146 are formed between the metal gate stacks and the dielectric layer 126. The sealed holes 146 are sealed by the sealing layer 144. The sealed holes 146 may serve as air spacers that have low dielectric constant of about 1. The corresponding parasitic capacitance is greatly reduced. The device performance and power consumption are significantly improved.

The sealing layer 144 may be made of or include carbon-containing silicon oxide, silicon oxide, one or more other suitable materials, or a combination thereof. In some embodiments, the compositions of the sealing layer 144 and of the inner spacers 110' are substantially the same. In some other embodiments, the compositions of the sealing layer 144 and of the inner spacers 110' are different from each other. In some embodiments, each of the inner spacers 110' has a greater atomic concentration of nitrogen than that of the sealing layer 144. In some embodiments, the sealing layer 144 has a dielectric constant that is lower than that of the etch stop layer 124.

The sealing layer 144 may be deposited using a CVD process, a PECVD process, one or more other applicable processes, or a combination thereof. In some embodiments, the formation of the sealing layer 144 also involves one or more etching operations. The deposition operation and etching operation may be alternately and sequentially performed to ensure the upper enlarged portions of the recesses 142' are filled with the sealing layer 144 while the lower portion of the recesses 142' are substantially not occupied by the sealing layer 144.

As shown in FIG. 1P, the sealing layer 144 is planarized to expose the inner spacers 110', in accordance with some embodiments. As a result, the remaining portions of the sealing layer 144 in the recesses 142' form sealing elements 148. In some embodiments, the top surfaces of the sealing elements 148 are substantially level with the dielectric layer 126 and/or the protective elements 138.

The sealing layer 144 may be planarized using a CMP process, a grinding process, an etching process, a dry polishing process, one or more other applicable processes, or a combination thereof. In some embodiments, the planarization process also partially remove and thin the dielectric layer 126, the protective elements 138, the inner spacers 110', the etching stop layer 124, and the conductive contact 140. After the planarization process, each of the sealing elements 148 may have a thickness that is in a range from about 3 nm to about 5 nm.

FIG. 2G is an enlarged cross-sectional view showing the profile of the sealing element 148, in accordance with some embodiments. In some embodiments, the sizes (including widths and heights) and profile of the sealing element 148 are substantially the same as the upper portion of the recess 142. In some embodiments, the bottom of the sealing element 148 is a curved surface, as shown in FIG. 2G. In some embodiments, the bottom of the sealing element 148 is a convex surface facing downwards.

As shown in FIG. 1Q, an etch stop layer 150 is deposited over the structure shown in FIG. 1P, in accordance with some embodiments. In some embodiments, the material of the etch stop layer 150 is different than the material of the etch stop layer 124, the inner spacers 110', or the sealing elements 148. In some embodiments, the etch stop layer 150 is made of or includes a metal oxide material. The etch stop layer 150 may be made of or include aluminum oxide, titanium oxide, one or more other suitable materials, or a combination thereof. However, embodiments of the disclosure have many variations. In some other embodiments, the material of the etch stop layer 150 is the same as or similar to the material of the etch stop layer 124. The etch stop layer 150 may be deposited using a CVD process, an ALD process, a PECVD process, one or more other applicable processes, or a combination thereof.

Afterwards, a dielectric layer 152 is formed over the etch stop layer 150, as shown in FIG. 1Q in accordance with some embodiments. The material and formation method of the dielectric layer 152 may be the same as or similar to those of the dielectric layer 126.

As shown in FIG. 1R, contact openings 154 are formed to expose the metal gate stacks 136A, 136B, and 136C, in accordance with some embodiments. One or more photolithography processes and one or more etching processes may be used to form the openings 154. In some embodiments, the dielectric layer 152 is partially removed to expose the etch stop layer 150. In some embodiments as mentioned above, the etch stop layer 150 is made of a metal oxide material such as aluminum oxide. In these cases, the etch stop layer 150 is then partially removed using a wet etching process. The solution used in the wet etching process may include a solution including HCl, $H_2O_2$, and $H_2O$ and/or a solution including $NH_4OH$, $H_2O_2$, and $H_2O$.

The solution used in the wet etching process mentioned above substantially does not etch the elements under the etch stop layer 150. Therefore, even if an overlay shift occurs to expose the inner spacers 110', the sealing elements 148, and/or the etch stop layer 124, these elements are substantially not damaged by the wet etching process of the etch stop layer 150. Since the sealing elements 148 are prevented from being damaged, the sealed holes 146 may remain protected. In some embodiments where the protective elements 138 are formed, another etching process is used to partially remove the protective elements 138 to expose the metal gate stacks 136A, 136B, and 136C.

As shown in FIG. 1S, a contact opening 156 is formed to expose the conductive contact 140, in accordance with some embodiments. One or more photolithography processes and one or more etching processes may be used to form the opening 156. In some embodiments, the dielectric layer 152 is partially removed to expose the etch stop layer 150. In some embodiments as mentioned above, the etch stop layer 150 is made of a metal oxide material such as aluminum oxide. In these cases, the etch stop layer 150 is then partially removed to expose the conductive contact 140 using the wet etching process mentioned above. Therefore, even if an overlay shift occurs such that the inner spacers 110', the sealing elements 148, and/or the etch stop layer 124 are exposed, these elements are substantially not damaged by the wet etching process of the etch stop layer 150. Since the sealing elements 148 are prevented from being damaged, the sealed holes 146 may remain protected.

Many variations and/or modifications can be made to embodiments of the disclosure. The formation sequence of the contact openings 154 and 156 may be switched. In some embodiments, the contact opening 156 is formed before the formation of the contact openings 154.

As shown in FIG. 1T, conductive structures 158 and 160 are respectively formed in the contact openings 154 and 156, in accordance with some embodiments. In some embodiments, each of the conductive structures 158 penetrate through the dielectric layer 152 and the etch stop layer 150 to be electrically connected to the corresponding metal gate stack. Similarly, the conductive structure 160 penetrates through the dielectric layer 152 and the etch stop layer 150 to be electrically connected to the conductive contact 140. The material and formation method of the conductive structures 158 and 160 may be the same as or similar to those of the conductive contact 140.

Figure 3:
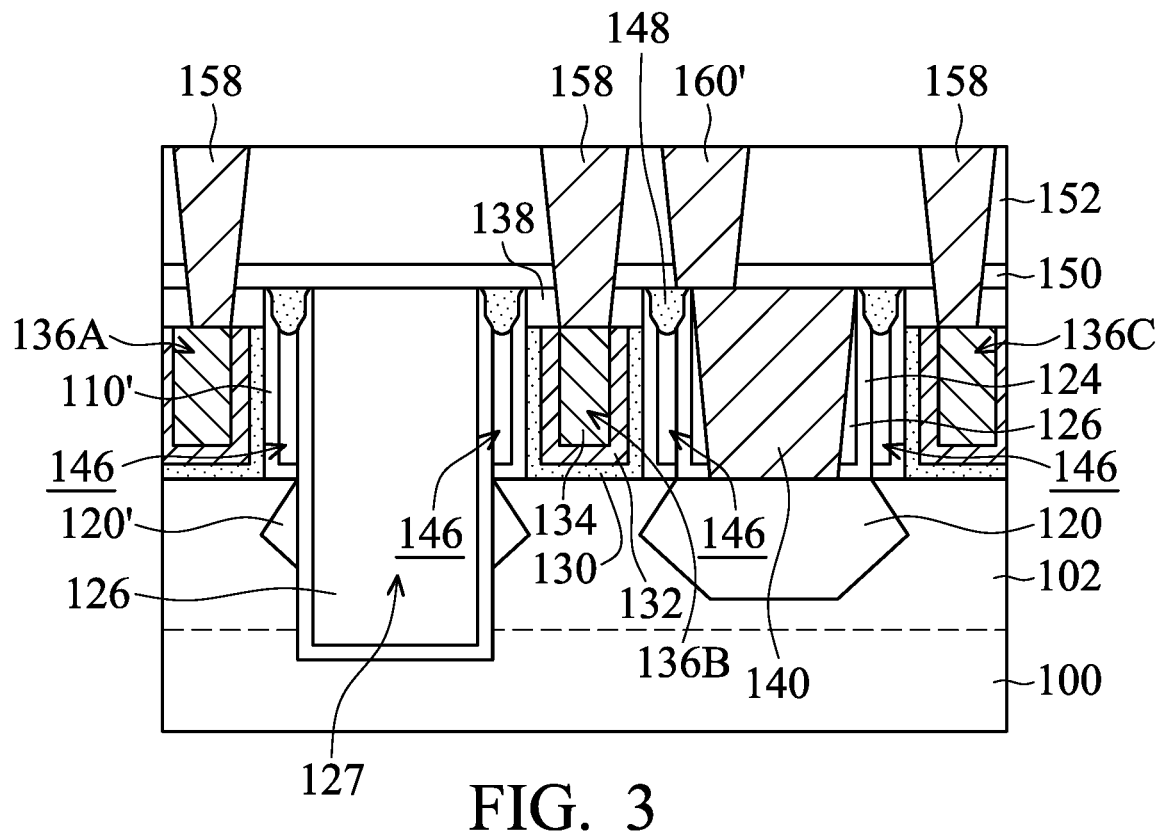
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. As mentioned above, in some cases, an overlay shift might occur during the formation of contact openings. As shown in FIG. 3, an overlay shift occurs such that a conductive structure 160' is formed directly above an interface between the conductive contact 140 and the dielectric layer 126 and/or an interface between the etch stop layer 124 and the sealing element 148. As mentioned above, even if the overlay shift occurs, the wet etching process of the etch stop layer 150 causes no damage to (or merely slightly damages) the sealing element 148 and/or the etch stop layer 124. In some embodiments, the conductive structure 160' is in direct contact with the sealing element 148, as shown in FIG. 3.

Figure 4:
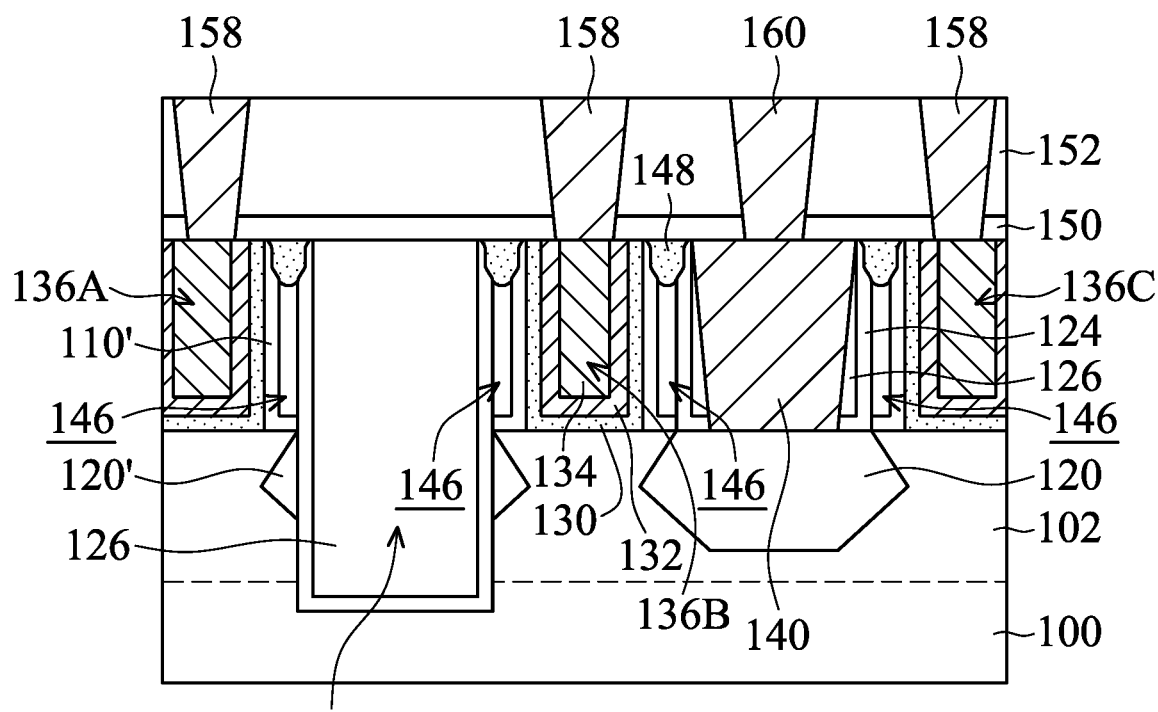
FIG. 4 is a cross-sectional view of a semiconductor device structure, in accordance with some embodiments.

Many variations and/or modifications can be made to embodiments of the disclosure. In some embodiments, the protective elements 138 are not formed. FIG. 4 is a cross-sectional view of a semiconductor device structure, in accordance with some embodiments. In some embodiments, the metal gate stacks 136A, 136B, and 136C are not etched back to form space for containing protective elements. In some embodiments, the top surfaces of the metal gate stacks 136A, 136B, and 136C are substantially level with the top surfaces of the sealing elements 148 and/or the dielectric layer 126.

Figure 5:
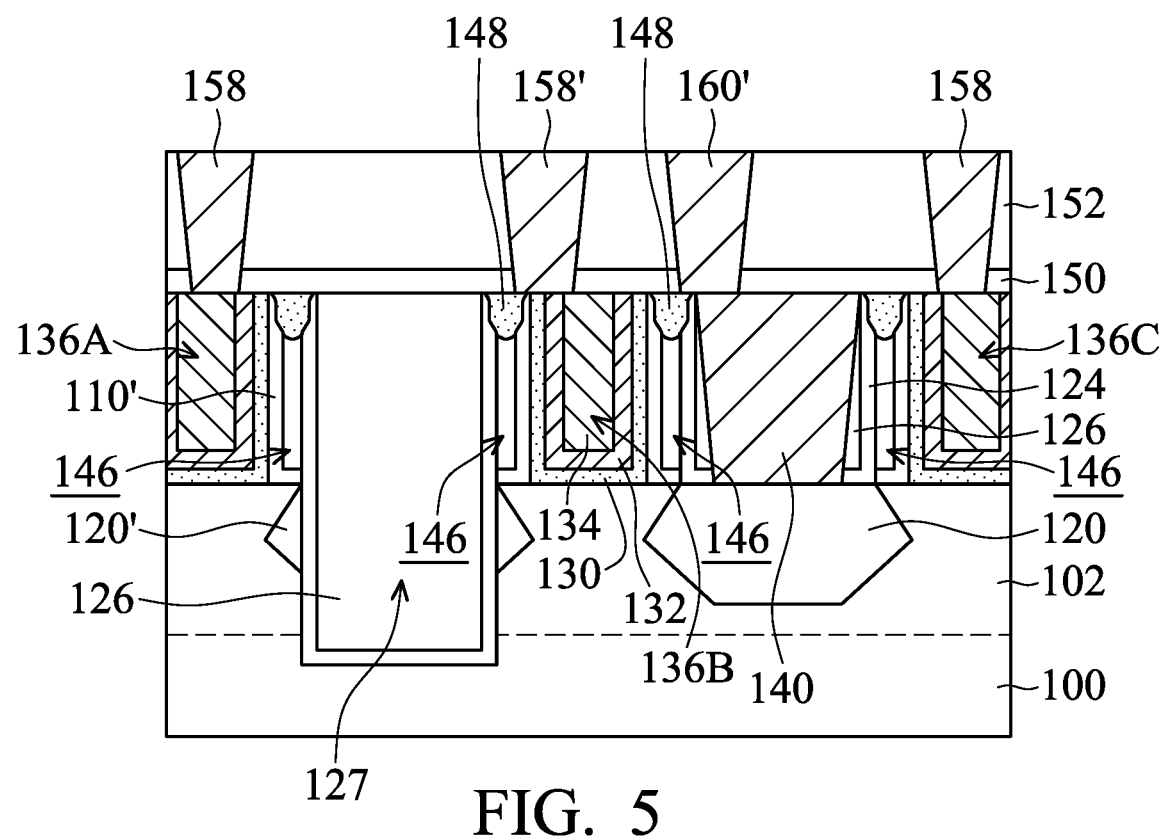
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. As mentioned above, in some cases, an overlay shift might occur during the formation of contact openings. In some embodiments, an overlay shift occurs such that a conductive structure 158' is formed directly above an interface between the sealing element 148 and the inner spacer 110'. As mentioned above, even if the overlay shift occurs, the wet etching process of the etch stop layer 150 substantially causes no damage to the sealing element 148 and/or the inner spacer 110'. In some embodiments, the conductive structure 158' is in direct contact with the sealing element 148, as shown in FIG. 5.

Embodiments of the disclosure form a spacer element and a dummy spacer over a sidewall of a gate stack. The dummy spacer is removed after a contact formation process in a dielectric layer. As a result, a recess originally occupied by the dummy spacer is formed between the spacer element and the dielectric layer. Afterwards, a sealing element is formed to seal the recess so as to form a sealed hole that is surrounded by the spacer element, the sealing element, and the dielectric layer. The sealed hole may serve as an air spacer that has low dielectric constant. The parasitic capacitance is therefore greatly reduced. The device performance and power consumption are significantly improved. Embodiments of the disclosure may also involve laterally etching the spacer element to enlarge the recess before the formation of the sealing element, which facilitates the subsequent formation of the sealing element. The reliability and performance of the semiconductor device structure are enhanced.

In accordance with some embodiments, a method for forming a semiconductor device structure is provided. The method includes forming a dummy gate stack over a semiconductor substrate and forming a spacer element over a sidewall of the dummy gate stack. The spacer element has an inner spacer and a dummy spacer, and the inner spacer is between the dummy spacer and the dummy gate stack. The method also includes forming a dielectric layer to surround the spacer element and the dummy gate stack and replacing the dummy gate stack with a metal gate stack. The method further includes removing the dummy spacer of the spacer element to form a recess between the inner spacer and the dielectric layer. In addition, the method includes forming a sealing element to seal the recess such that a sealed hole is formed between the metal gate stack and the dielectric layer.

In accordance with some embodiments, a method for forming a semiconductor device structure is provided. The method includes forming a dielectric layer to surround a spacer element and a gate stack. The spacer element is between the dielectric layer and the gate stack. The spacer element has an inner spacer and a dummy spacer, and the dummy spacer is between the inner spacer and the dielectric layer. The method also includes removing the dummy spacer to form a recess between the inner spacer and the dielectric layer. The method further includes partially removing the inner spacer such that an upper portion of the recess becomes wider than a lower portion of the recess. In addition, the method includes forming a sealing element to partially or completely fill the upper portion of the recess such that a sealed hole is formed between the inner spacer and the dielectric layer.

In accordance with some embodiments, a semiconductor device structure is provided. The semiconductor device structure includes a semiconductor substrate and a gate stack over the semiconductor substrate. The semiconductor device structure also includes a spacer element extending along a sidewall of the gate stack. The semiconductor device structure further includes a dielectric layer surrounding the gate stack and the spacer element. In addition, the semiconductor device structure includes a sealing element between the spacer element and the dielectric layer. A sealed hole is surrounded by the sealing element and the spacer element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dummy gate stack over a semiconductor substrate;
    forming a spacer element over a sidewall of the dummy gate stack, wherein the spacer element has an inner spacer and a dummy spacer, and the inner spacer is between the dummy spacer and the dummy gate stack;
    forming a dielectric layer to surround the spacer element and the dummy gate stack;
    replacing the dummy gate stack with a metal gate stack;
    removing the dummy spacer of the spacer element to form a recess between the inner spacer and the dielectric layer;
    partially removing the inner spacer to enlarge an upper portion of the recess before the sealing element is formed such that a lower portion of the inner spacer is wider than an upper portion of the inner spacer; and
    forming a sealing element to seal the recess such that a sealed hole is formed between the metal gate stack and the dielectric layer.

2. The method for forming a semiconductor device structure as claimed in claim 1, wherein the dummy spacer is made of silicon, silicon germanium, boron-doped silicon, boron-doped silicon germanium, or a combination thereof.

3. The method for forming a semiconductor device structure as claimed in claim 1, further comprising forming an etch stop layer over the spacer element and the semiconductor substrate before the dielectric layer is formed.

4. The method for forming a semiconductor device structure as claimed in claim 3, further comprising partially removing the etching stop layer to enlarge the upper portion of the recess before the sealing element is formed.

5. The method for forming a semiconductor device structure as claimed in claim 1, further comprising:
    forming a protection layer over the inner spacer and the metal gate stack before the upper portion of the recess is enlarged, wherein the protection layer has a first portion and a second portion, the first portion covers top surfaces of the inner spacer and the metal gate stack, the second portion partially covers a sidewall of the inner spacer, and the first portion is thicker than the second portion; and
    performing an etching operation on the protection layer and the inner spacer, wherein the etching operation removes the second portion of the protection layer and partially removes the inner spacer from an upper portion of the sidewall of the inner spacer while a remaining part of the first portion of the protection layer covers the top surfaces of the inner spacer and the metal gate stack.

6. The method for forming a semiconductor device structure as claimed in claim 5, further comprising:
   forming a second protection layer over the inner spacer and the metal gate stack after the etching operation, wherein the second protection layer covers the remaining part of the first portion of the protection layer, and a portion of the second protection layer partially covers an etched sidewall of the inner spacer; and
   performing a second etching operation on the second protection layer and the inner spacer, wherein the second etching operation partially removes the inner spacer from the etched sidewall of the inner spacer.

7. The method for forming a semiconductor device structure as claimed in claim 1, further comprising alternately and sequentially introducing a first plasma and a second plasma to the inner spacer after the dummy spacer is removed and before the sealing element is formed, wherein the first plasma is used to deposit a protection material over the inner spacer, and the second plasma is used to partially remove the protection material and to partially remove the inner spacer.

8. The method for forming a semiconductor device structure as claimed in claim 7, wherein a first reaction gas mixture used to generate the first plasma comprises $CH_4$, $C_4F_6$, $C_4F_8$, $CH_3F$, $SO_2$, $SiCl_4$, $O_2$, or a combination thereof, and a second reaction gas mixture used to generate the second plasma comprises $CF_4$, $CHF_3$, or a combination thereof.

9. The method for forming a semiconductor device structure as claimed in claim 1, further comprising:
   forming a sealing layer over the metal gate stack and the dielectric layer, wherein a portion of the sealing layer extends into the recess; and
   planarizing the sealing layer to expose the inner spacer, wherein a remaining portion of the sealing layer forms the sealing element.

10. The method for forming a semiconductor device structure as claimed in claim 1, wherein the inner spacer is partially removed while a top surface of the inner spacer is protected.

11. A method for forming a semiconductor device structure, comprising:
   forming a dielectric layer to surround a spacer element and a gate stack, wherein the spacer element is between the dielectric layer and the gate stack, the spacer element has an inner spacer and a dummy spacer, and the dummy spacer is between the inner spacer and the dielectric layer;
   removing the dummy spacer to form a recess between the inner spacer and the dielectric layer;
   partially removing the inner spacer such that an upper portion of the recess becomes wider than a lower portion of the recess, wherein the operation of partially removing the inner spacer comprises laterally etching a sidewall of the inner spacer while a top surface of the inner spacer is protected; and
   forming a sealing element to at least partially fill the upper portion of the recess such that a sealed hole is formed between the inner spacer and the dielectric layer.

12. The method for forming a semiconductor device structure as claimed in claim 11, further comprising alternately and sequentially introducing a first plasma and a second plasma to the inner spacer after the dummy spacer is removed and before the sealing element is formed, wherein the first plasma is used to deposit a protection material over the inner spacer, and the second plasma is used to partially remove the protection material and to partially remove the inner spacer.

13. The method for forming a semiconductor device structure as claimed in claim 11, further comprising:
   etching back the gate stack to form a trench over the gate stack; and
   forming a cap element in the trench before the dummy spacer is removed.

14. The method for forming a semiconductor device structure as claimed in claim 13, further comprising forming a conductive contact in the dielectric layer after the cap element is formed and before the dummy spacer is removed, wherein the inner spacer is between the gate stack and the conductive contact.

15. The method for forming a semiconductor device structure as claimed in claim 11, wherein the sealing element is formed to have an upper side and a lower side, and the upper side is wider than the lower side.

16. A semiconductor device structure, comprising:
   a semiconductor substrate;
   a gate stack over the semiconductor substrate;
   a spacer element extending along a sidewall of the gate stack;
   a dielectric layer surrounding the gate stack and the spacer element; and
   a sealing element between the spacer element and the dielectric layer, wherein a sealed hole is surrounded by the sealing element and the spacer element, an upper portion of the sealing element is wider than a lower portion of the sealing element, the lower portion of the sealing element has a convex bottom surface facing downwards, and a first portion of the spacer element beside the sealing element is thinner than a second portion of the spacer element beside the sealed hole.

17. The semiconductor device structure as claimed in claim 16, further comprising an etch stop layer, wherein an upper portion of the etch stop layer is between the sealing element and the dielectric layer, and a lower portion of the etch stop layer is between the dielectric layer and the sealed hole.

18. The semiconductor device structure as claimed in claim 17, further comprising:
   a second etch stop layer over the gate stack, the spacer element, the sealing element, the etch stop layer, and the dielectric layer, wherein the second etch stop layer is made of a metal oxide material;
   a second dielectric layer over the second etch stop layer; and
   a conductive structure penetrating through the second dielectric layer and the second etch stop layer, wherein the conductive structure is electrically connected to the gate stack.

19. The semiconductor device structure as claimed in claim 18, wherein the conductive structure is in direct contact with the sealing element.

20. The semiconductor device structure as claimed in claim 16, wherein top surfaces of the sealing element and the dielectric layer are substantially level with each other.

* * * * *